US012587192B2

(12) United States Patent
Finck et al.

(10) Patent No.: US 12,587,192 B2
(45) Date of Patent: Mar. 24, 2026

(54) MEDIATING COUPLING OF QUANTUM BITS USING CHAINS OF RESONATORS AND TUNABLE INDUCTIVE COUPLERS

(71) Applicant: International Business Machines Corporation, Armonk, NY (US)

(72) Inventors: Aaron Finck, White Plains, NY (US); David Zajac, Valley Cottage, NY (US); Jiri Stehlik, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/796,468

(22) Filed: Aug. 7, 2024

(65) Prior Publication Data

US 2026/0045947 A1      Feb. 12, 2026

(51) Int. Cl.
H03K 17/92 (2006.01)
G06N 10/40 (2022.01)

(52) U.S. Cl.
CPC ............. H03K 17/92 (2013.01); G06N 10/40 (2022.01)

(58) Field of Classification Search
CPC ...................................................... H03K 17/92
USPC ......................................................... 327/528
See application file for complete search history.

(56) References Cited

U.S. PATENT DOCUMENTS

| | | |
|---|---|---|
| 10,353,844 B2 | 7/2019 | Naaman et al. |
| 10,467,544 B2 | 11/2019 | Filipp et al. |
| 11,443,222 B2 | 9/2022 | Chow et al. |
| 2018/0336153 A1 | 11/2018 | Naaman et al. |
| 2021/0264308 A1 | 8/2021 | Sandberg et al. |
| 2022/0138611 A1 | 5/2022 | Siddiqi et al. |
| 2023/0153672 A1 | 5/2023 | Resch et al. |
| 2023/0162081 A1 | 5/2023 | Verresen et al. |
| 2023/0163762 A1 | 5/2023 | Yamaji et al. |
| 2023/0371404 A1 | 11/2023 | Hyyppa et al. |
| 2023/0394345 A1 | 12/2023 | Mckay |
| 2023/0401475 A1 | 12/2023 | Finck et al. |
| 2024/0046132 A1 | 2/2024 | Kumph |
| 2024/0078460 A1 | 3/2024 | Finck et al. |
| 2024/0086751 A1 | 3/2024 | Finck et al. |
| 2025/0225422 A1* | 7/2025 | Suttle ........................ H01P 5/00 |

OTHER PUBLICATIONS

M. Hinderling et al., "Flip-Chip-Based Microwave Spectroscopy of Andreev Bound States in a Planar Josephson Junction," Physical Review Applied, May 8, 2023, pp. 054026:1-054026:18, vol. 19.

(Continued)

*Primary Examiner* — Tomi Skibinski
(74) *Attorney, Agent, or Firm* — Erik Johnson; Ryan, Mason & Lewis, LLP

(57) ABSTRACT

Techniques are provided for mediating interactions (e.g., long range interactions) between quantum bits to facilitate quantum computing operations such as two-qubit gate operations. A device comprises a first quantum bit, a second quantum bit, and a coupling bus connecting the first quantum bit and the second quantum bit. The coupling bus comprises a plurality of transmission line resonators which are coupled in series, and at least one tunable inductive coupler to control a coupling between a first transmission line resonator and a second transmission line resonator of the plurality of transmission line resonators.

20 Claims, 10 Drawing Sheets

(56)     References Cited

OTHER PUBLICATIONS

J.-P. Zou et al., "Tunable Single-Photon Scattering of a Giant A-Type Atom in a Squid-Chain Waveguide," Frontiers in Physics, Apr. 27, 2022, 10 pages, vol. 10, No. 896827.

M. Khabipov et al., "Superconducting Microwave Resonators With Non-Centrosymmetric Nonlinearity," Cornell University Library, arXiv:2204.10133v1, Apr. 21, 2022, 12 pages.

B. Marinelli et al., "Dynamically Reconfigurable Photon Exchange in a Superconducting Quantum Processor," Cornell University Library, arXiv:2303.03507v1, Mar. 6, 2023, 22 pages.

J.-X. Han et al., "Multi-Qubit Phase Gate on Multiple Resonators Mediated by a Superconducting Bus," Optics Express, Jan. 20, 2020, pp. 1954-1969, vol. 28, No. 2.

H. Goto, "Double-Transmom Coupler: Fast Two-Qubit Gate with No Residual Coupling for Highly Detuned Superconducting Qubits," Physical Review Applied, arXiv:2203.11451v2, Sep. 27, 2022, 10 pages.

F. Wulschner et al., "Tunable Coupling of Transmission-line Microwave Resonators Mediated by an rfSUID," EPJ Quantum Technology, Jul. 28, 2016, 10 pages, vol. 3, No. 10.

International Searching Authority, Notification of Transmittal of the International Search Report and the Written Opinion of the International Searching Authority, or the Declaration, Application No. PCT/EP2025/071596, Oct. 14, 2025, 12 pages.

* cited by examiner

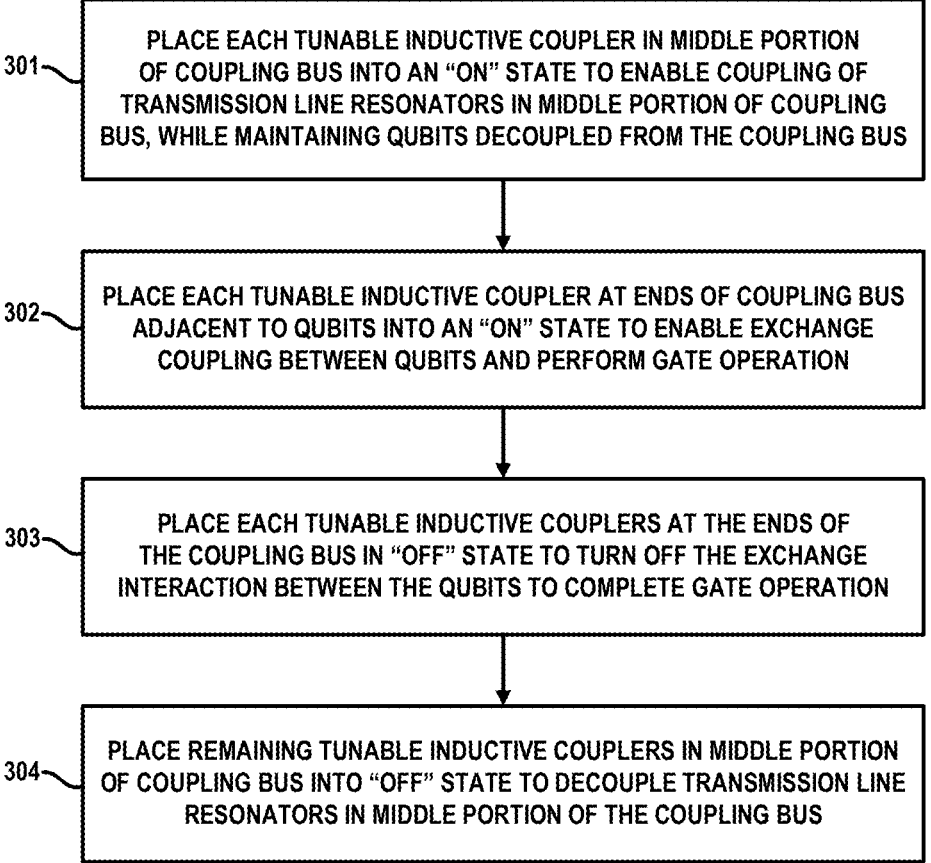

301 — PLACE EACH TUNABLE INDUCTIVE COUPLER IN MIDDLE PORTION OF COUPLING BUS INTO AN "ON" STATE TO ENABLE COUPLING OF TRANSMISSION LINE RESONATORS IN MIDDLE PORTION OF COUPLING BUS, WHILE MAINTAINING QUBITS DECOUPLED FROM THE COUPLING BUS

302 — PLACE EACH TUNABLE INDUCTIVE COUPLER AT ENDS OF COUPLING BUS ADJACENT TO QUBITS INTO AN "ON" STATE TO ENABLE EXCHANGE COUPLING BETWEEN QUBITS AND PERFORM GATE OPERATION

303 — PLACE EACH TUNABLE INDUCTIVE COUPLERS AT THE ENDS OF THE COUPLING BUS IN "OFF" STATE TO TURN OFF THE EXCHANGE INTERACTION BETWEEN THE QUBITS TO COMPLETE GATE OPERATION

304 — PLACE REMAINING TUNABLE INDUCTIVE COUPLERS IN MIDDLE PORTION OF COUPLING BUS INTO "OFF" STATE TO DECOUPLE TRANSMISSION LINE RESONATORS IN MIDDLE PORTION OF THE COUPLING BUS

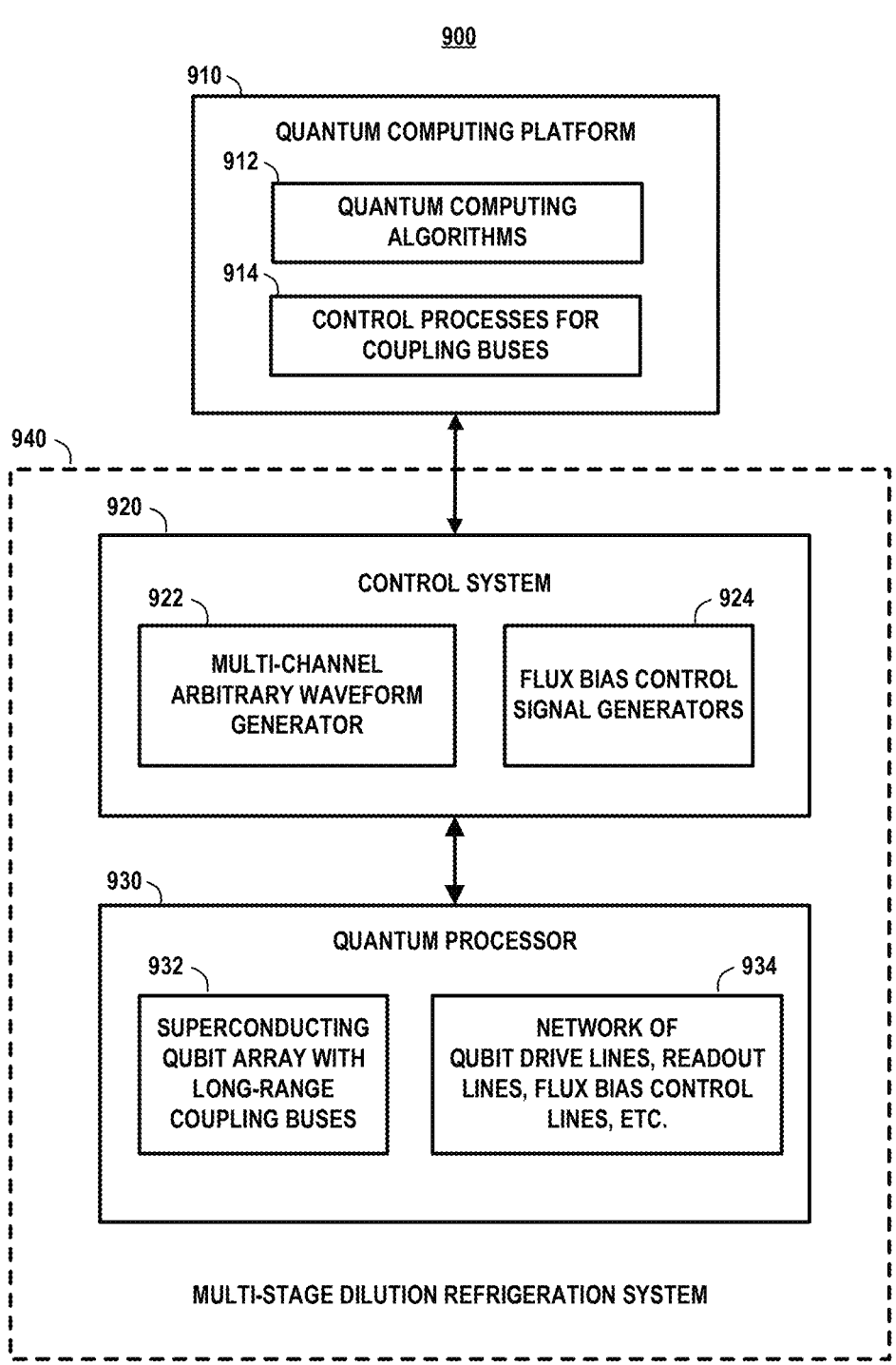

910

QUANTUM COMPUTING PLATFORM

912

QUANTUM COMPUTING
ALGORITHMS

914

CONTROL PROCESSES FOR
COUPLING BUSES

940

920

CONTROL SYSTEM

922

MULTI-CHANNEL
ARBITRARY WAVEFORM
GENERATOR

924

FLUX BIAS CONTROL
SIGNAL GENERATORS

930

QUANTUM PROCESSOR

932

SUPERCONDUCTING
QUBIT ARRAY WITH
LONG-RANGE
COUPLING BUSES

934

NETWORK OF
QUBIT DRIVE LINES, READOUT
LINES, FLUX BIAS CONTROL
LINES, ETC.

MULTI-STAGE DILUTION REFRIGERATION SYSTEM

Figure 10:
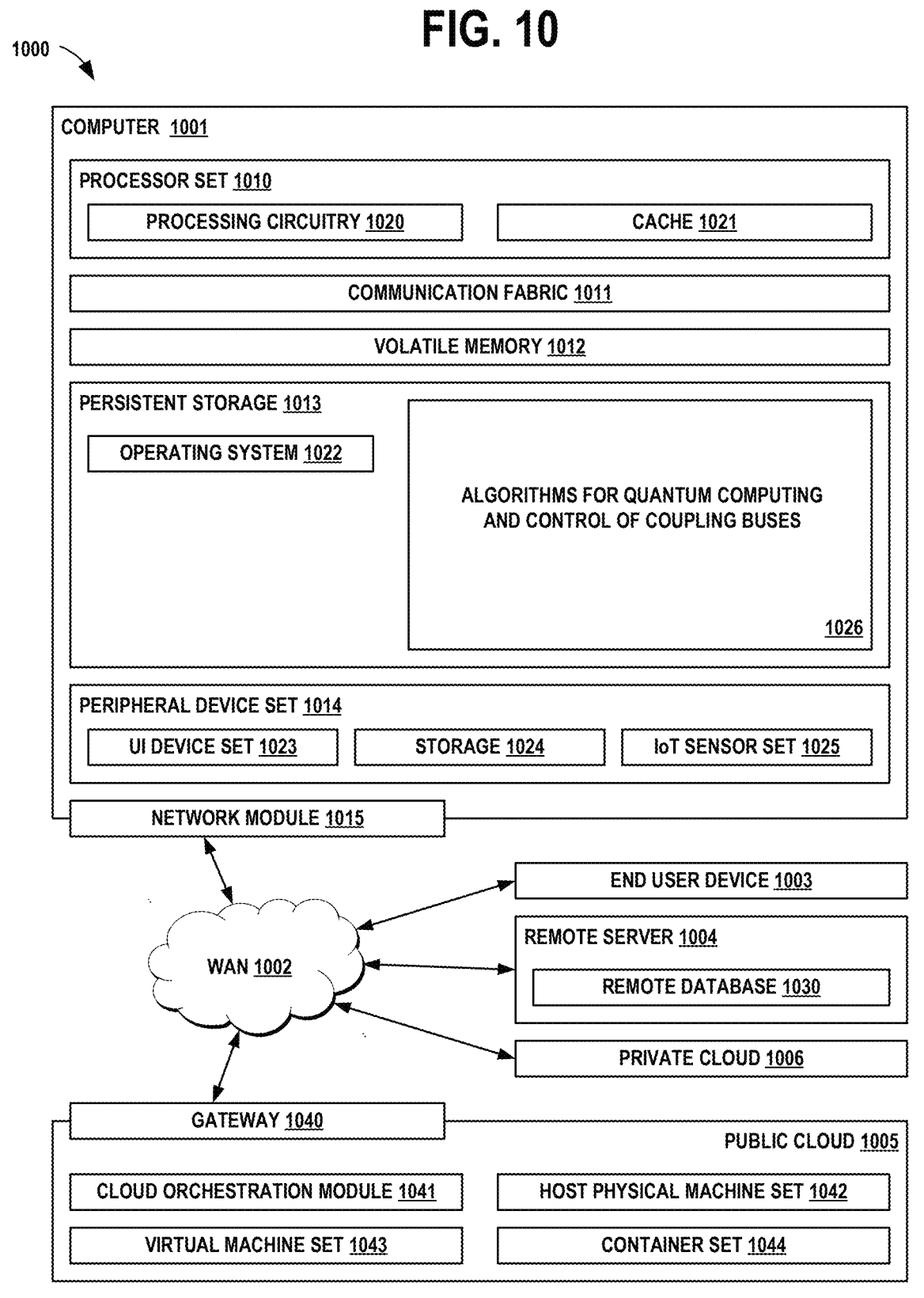

COMPUTER 1001

PROCESSOR SET 1010

PROCESSING CIRCUITRY 1020 | CACHE 1021

COMMUNICATION FABRIC 1011

VOLATILE MEMORY 1012

PERSISTENT STORAGE 1013

OPERATING SYSTEM 1022

ALGORITHMS FOR QUANTUM COMPUTING AND CONTROL OF COUPLING BUSES

1026

PERIPHERAL DEVICE SET 1014

UI DEVICE SET 1023 | STORAGE 1024 | IoT SENSOR SET 1025

NETWORK MODULE 1015

WAN 1002

END USER DEVICE 1003

REMOTE SERVER 1004

REMOTE DATABASE 1030

PRIVATE CLOUD 1006

GATEWAY 1040

PUBLIC CLOUD 1005

CLOUD ORCHESTRATION MODULE 1041 | HOST PHYSICAL MACHINE SET 1042

VIRTUAL MACHINE SET 1043 | CONTAINER SET 1044

MEDIATING COUPLING OF QUANTUM BITS USING CHAINS OF RESONATORS AND TUNABLE INDUCTIVE COUPLERS

BACKGROUND

This disclosure relates generally to superconducting quantum computing systems and, in particular, techniques for mediating interactions between quantum bits using coupling buses. A quantum computing system can be implemented using superconducting circuit quantum electrodynamics (cQED) architectures that are constructed using quantum circuit components such as, e.g., superconducting quantum bits and other types of superconducting quantum devices that are controlled using microwave and/or flux bias control signals. In general, superconducting quantum bits (qubits) are electronic circuits which are implemented using components such as superconducting tunnel junctions (e.g., Josephson junctions), superconducting quantum interference devices (SQUIDs), inductors, and/or capacitors, etc., and which behave as quantum mechanical anharmonic (nonlinear) oscillators with quantized states, when cooled to cryogenic temperatures. A qubit can be effectively operated as a two-level system in a computational subspace comprising a ground state |0> and a first excited state |1> of the qubit, due to the anharmonicity imparted by a non-linear inductor element (e.g., Josephson junction inductance) of the qubit, which allows the ground and the first excited states to be uniquely addressed at a transition frequency of the qubit, without significantly disturbing higher excited states of the qubit (e.g., |2>, |3> etc.).

Various types of quantum information processing algorithms can be implemented using a superconducting quantum processor which comprises multiple superconducting qubits which can be coherently controlled, placed into quantum superposition states, exhibit quantum interference effects, and become entangled with one another, by applying various types of quantum gate operations (e.g., single-qubit gate operations, two-qubit gate operations, etc.) to the superconducting qubits. As quantum processors are scaled with increasing numbers of superconducting qubits and higher integration densities, a primary challenge is being able to scale up the number of qubits without introducing additional channels of noise and unwanted exchange interactions between qubits which can result in correlated gate errors. For example, with increasing numbers of qubits on a given quantum chip, the ability to implement long-range interactions (e.g., several millimeters) between pairs of qubits on the quantum chip becomes increasingly problematic to achieve high on/off ratios of qubit-qubit exchange couplings, and to prevent unwanted interactions with spectator qubits, which are desired to ensure high-speed and high-fidelity gate operations.

SUMMARY

Exemplary embodiments of the disclosure include techniques for mediating interactions (e.g., long range interactions) between quantum bits to facilitate quantum computing operations such as two-qubit gate operations.

An exemplary embodiment includes a device which comprises a first quantum bit, a second quantum bit, and a coupling bus connecting the first quantum bit and the second quantum bit. The coupling bus comprises a plurality of transmission line resonators which are coupled in series, and at least one tunable inductive coupler to control a coupling between a first transmission line resonator and a second transmission line resonator of the plurality of transmission line resonators.

Another exemplary embodiment includes a system which comprises a quantum processor and a control system. The quantum processor comprises a first quantum bit, a second quantum bit, and a coupling bus connecting the first quantum bit and the second quantum bit. The coupling bus comprises a plurality of transmission line resonators which are coupled in series, and at least one tunable inductive coupler to control a coupling between a first transmission line resonator and a second transmission line resonator of the plurality of transmission line resonators. The control system is configured to generate a control signal to tune the at least one tunable inductive coupler of the coupling bus into one of: a first operating state to couple the first transmission line resonator and the second transmission line resonator to enable exchange coupling between the first quantum bit and the second quantum bit over the coupling bus; and a second operating state to decouple the first transmission line resonator and the second transmission line resonator to suppress exchange coupling between the first quantum bit and the second quantum bit over the coupling bus.

Another exemplary embodiment comprises a method which comprises controlling an exchange interaction between a first quantum bit and a second quantum bit that are connected by a coupling bus which comprises a plurality of transmission line resonators that are coupled in series, and at least one tunable inductive coupler to control a coupling between a first transmission line resonator and a second transmission line resonator of the plurality of transmission line resonators, wherein controlling the exchange interaction between the first quantum bit and the second quantum bit comprises: tuning the at least one tunable inductive coupler of the coupling bus into a first operating state to couple the first transmission line resonator and the second transmission line resonator to enable exchange coupling between the first quantum bit and the second quantum bit over the coupling bus; and tuning the at least one tunable inductive coupler of the coupling bus into a second operating state to decouple the first transmission line resonator and the second transmission line resonator to suppress exchange coupling between the first quantum bit and the second quantum bit over the coupling bus.

Other embodiments will be described in the following detailed description of exemplary embodiments, which is to be read in conjunction with the accompanying figures.

BRIEF DESCRIPTION OF THE DRAWINGS

FIG. 3 illustrates a flow diagram of a method for utilizing a coupling bus to mediate interactions between quantum bits, according to an exemplary embodiment of the disclosure.

FIG. 9 schematically illustrates a quantum computing system which comprises a quantum processor having superconducting qubits that are coupled by long-range coupling buses, according to an exemplary embodiment of the disclosure.

FIG. 10 schematically illustrates an exemplary architecture of a computing environment for hosting a quantum computing platform and performing quantum information processing, according to an exemplary embodiment of the disclosure.

DETAILED DESCRIPTION

Figure 1:
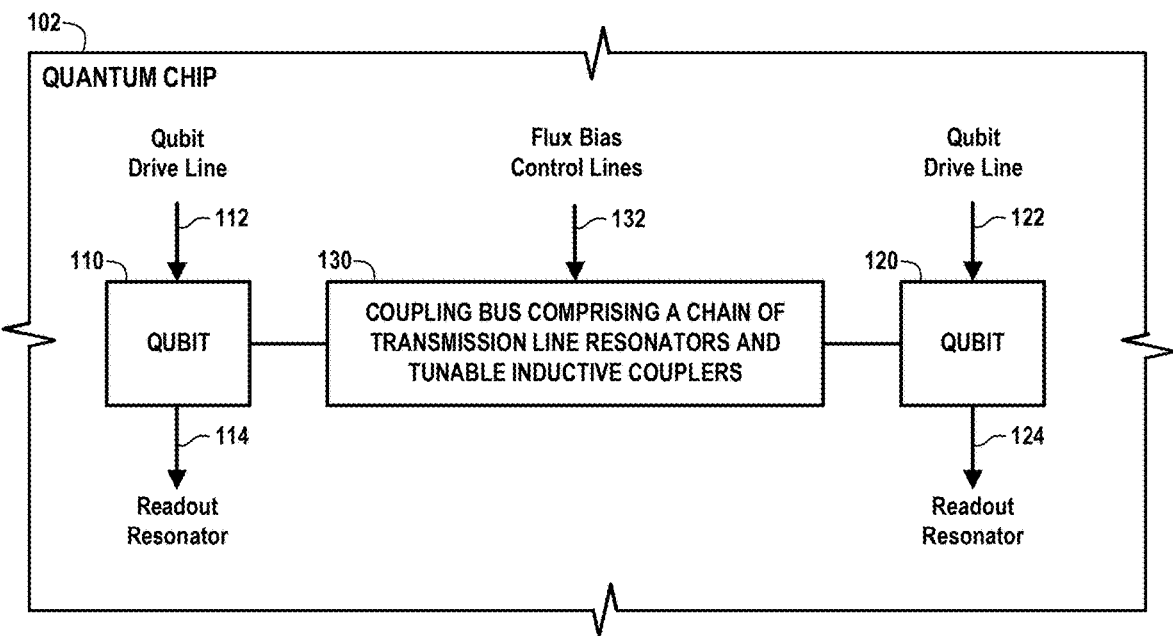
FIG. 1 schematically illustrates a device which comprises a coupling bus that is configured to mediate interactions between quantum bits, according to an exemplary embodiment of the disclosure.

Exemplary embodiments of the disclosure will now be described in further detail with regard to techniques for mediating interactions (e.g., long range interactions) between quantum bits to facilitate quantum computing operations such as two-qubit gate operations.

An exemplary embodiment includes a device which comprises a first quantum bit, a second quantum bit, and a coupling bus connecting the first quantum bit and the second quantum bit. The coupling bus comprises a plurality of transmission line resonators which are coupled in series, and at least one tunable inductive coupler to control a coupling between a first transmission line resonator and a second transmission line resonator of the plurality of transmission line resonators.

Advantageously, the exemplary coupling bus architectures as discussed herein enable long-range, highly tunable control of exchange interactions between qubits. The exemplary coupling bus architectures are designed to eliminate low-frequency modes that are normally present in long-range buses, and provide fast and high ON/OFF ratios of qubit-qubit exchange interactions by virtue of separating a coupling bus into multiple segments of transmission line resonators, and utilizing flux-tunable inductive couplers to dynamically control the inductive coupling of the transmission line resonators, or utilizing a combination of flux-tunable inductive couplers and fixed interactions using fixed coupling capacitor or coupling inductors, to couple the multiple segments of transmission line resonators.

In another exemplary embodiment, which may be combined with one or more of the embodiments of the preceding paragraphs, the at least one tunable inductive coupler is configured to be tuned into one of: a first operating state to couple the first transmission line resonator and the second transmission line resonator to enable exchange coupling between the first quantum bit and the second quantum bit over the coupling bus; and a second operating state to decouple the first transmission line resonator and the second transmission line resonator to suppress exchange coupling between the first quantum bit and the second quantum bit over the coupling bus.

Another exemplary embodiment includes a system which comprises a quantum processor and a control system. The quantum processor comprises a first quantum bit, a second quantum bit, and a coupling bus connecting the first quantum bit and the second quantum bit. The coupling bus comprises a plurality of transmission line resonators which are coupled in series, and at least one tunable inductive coupler to control a coupling between a first transmission line resonator and a second transmission line resonator of the plurality of transmission line resonators. The control system is configured to generate a control signal to tune the at least one tunable inductive coupler of the coupling bus into one of: a first operating state to couple the first transmission line resonator and the second transmission line resonator to enable exchange coupling between the first quantum bit and the second quantum bit over the coupling bus; and a second operating state to decouple the first transmission line resonator and the second transmission line resonator to suppress exchange coupling between the first quantum bit and the second quantum bit over the coupling bus.

Another exemplary embodiment comprises a method which comprises controlling an exchange interaction between a first quantum bit and a second quantum bit that are connected by a coupling bus which comprises a plurality of transmission line resonators that are coupled in series, and at least one tunable inductive coupler to control a coupling between a first transmission line resonator and a second transmission line resonator of the plurality of transmission line resonators, where controlling the exchange interaction between the first quantum bit and the second quantum bit comprises: tuning the at least one tunable inductive coupler of the coupling bus into a first operating state to couple the first transmission line resonator and the second transmission line resonator to enable exchange coupling between the first quantum bit and the second quantum bit over the coupling bus; and tuning the at least one tunable inductive coupler of the coupling bus into a second operating state to decouple the first transmission line resonator and the second transmission line resonator to suppress exchange coupling between the first quantum bit and the second quantum bit over the coupling bus.

In another exemplary embodiment, which may be combined with one or more of the embodiments of the preceding paragraphs, tuning the at least one tunable inductive coupler of the coupling bus into the first operating state to couple the first transmission line resonator and the second transmission line resonator to enable exchange coupling between the first quantum bit and the second quantum bit over the coupling bus, comprises generating control signal to flux-bias the at least one tunable inductive coupler of the coupling bus into the first operating state to inductively couple the first transmission line resonator and the second transmission line resonator and cause mode hybridization of frequency modes of the first transmission line resonator and the second transmission line resonator to generate a hybridized frequency mode which moves towards respective transition frequencies of the first quantum bit and the second quantum bit.

In another exemplary embodiment, which may be combined with one or more of the embodiments of the preceding paragraphs, the first transmission line resonator and the second transmission line resonator are nominally identical and have a resonant frequency that is greater than the transition frequencies of the first quantum bit and the second quantum bit, wherein the hybridized frequency mode has a frequency that is less than the resonant frequency of the at least two transmission line resonators.

In another exemplary embodiment, which may be combined with one or more of the embodiments of the preceding paragraphs, the plurality of transmission line resonators comprise nominally identical coplanar waveguide resonators.

In another exemplary embodiment, which may be combined with one or more of the embodiments of the preceding paragraphs, the at least one tunable inductive coupler comprises a superconducting loop comprising at least one Josephson junction.

In another exemplary embodiment, which may be combined with one or more of the embodiments of the preceding paragraphs, the at least one tunable inductive coupler comprises a radio frequency superconducting quantum interference device.

In another exemplary embodiment, which may be combined with one or more of the embodiments of the preceding paragraphs, the at least one tunable inductive coupler comprises a direct current superconducting quantum interference device.

In another exemplary embodiment, which may be combined with one or more of the embodiments of the preceding paragraphs, the coupling bus further comprises at least one fixed coupling device to provide a fixed coupling between the second transmission line resonator and a third transmission line resonator of the plurality of transmission line resonators.

In another exemplary embodiment, which may be combined with one or more of the embodiments of the preceding paragraphs, the fixed coupling device comprises one of a coupling capacitor and a coupling inductor.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum bits, coupling buses, tunable inductive couplers, control circuitry, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

In addition, the term "quantum chip" or "qubit chip" as used herein refers to a die (e.g., semiconductor die) which comprises a superconducting electronic integrated circuit comprising various superconducting components such as qubits, tunable couplers, ground planes, signal coplanar waveguides, and resonators, etc. A plurality of dies having the same and/or different configurations of superconducting electronic integrated circuits, can be fabricated on a wafer (e.g., semiconductor wafer), wherein the individual dies can be diced (cut) from the wafer using a die singulation process to provide singulated dies which can be packaged together to construct a modular quantum processor architecture. The terms "quantum chip" and "qubit chip" and "die" are synonymous terms and used interchangeably herein.

For large-scale quantum computation, a quantum processor comprising an array of superconducting qubits can utilize couplers to mediate intra-chip qubit-qubit interactions to, e.g., enable high-fidelity two-qubit gate operations (e.g., entanglement operations). For example, coplanar waveguide (CPW) transmission line resonators (or CPW resonators) can be utilized to enable long-range interactions (i.e. several millimeters) between two qubits disposed on a given quantum chip. However, utilizing CPW resonators to implement long-range coupling between qubits can be problematic for various reasons. For example, when utilizing CPW resonators for long-range qubit-qubit coupling, it is difficult to achieve high ON/OFF ratios for qubit-qubit exchange interactions. Indeed, the ability to quicky turn ON and turn OFF the exchange interaction between two qubits is needed to achieve high-speed and high-fidelity two-qubit gate operations. Moreover, utilizing a CPW resonator alone to implement long-range qubit-qubit coupling makes it difficult to control unwanted interactions with spectator qubits.

In addition, when utilizing relatively long CPW resonators for qubit-qubit coupling, such CPW resonators can possess multiple low-frequency (<4 GHz) modes, which may couple to the qubits. Such low-frequency modes are undesirable as they could possess excess thermal population of their excited states, which can potentially cause dephasing of the qubits due to the longitudinal coupling between the qubits and the low frequency modes. In this regard, the transition frequencies of the qubits can shift in response to the state of the population of the low frequency modes, leading to gate errors.

To address the above-noted disadvantages associated with long-range qubit-qubit coupling, exemplary embodiments of the disclosure provide coupling buses and coupling techniques to mediate long-range interactions between qubits, while suppressing the formation of low-frequency modes within long-range coupling buses, and robustly suppressing spectator effects in a superconducting quantum computer. As explained in detail below, the exemplary long-range qubit-qubit coupling buses and techniques as described herein are designed to eliminate unwanted low-frequency modes that can arise in long-range buses, and provide high ON/OFF ratio of long-range interactions between qubits by implementing a coupling buses which comprise multiple trans-
mission line resonators that are coupled together using
flux-tunable inductive couplers, or a combination of flux-
tunable inductive couplers and fixed coupling device (cou-
pling capacitors and/or coupling inductors).

For example, FIG. 1 schematically illustrates a device
which comprises a coupling bus that is configured to medi-
ate interactions between quantum bits, according to an
exemplary embodiment of the disclosure. In particular, FIG.
1 schematically illustrates a device 100 which comprises a
quantum chip 102 and various quantum components dis-
posed on the quantum chip 102, where such quantum
components include, but are not limited to, a first qubit 110,
a second qubit 120, and a coupling bus 130 that is coupled
to the first and second qubits 110 and 120. In some embodi-
ments, the coupling bus 130 comprises a chain of transmis-
sion line resonators and one or more tunable inductive
couplers (e.g., flux-tunable inductive couplers) that are con-
figured to provide tunable inductive coupling between adja-
cent transmission line resonators. The first qubit 110 and the
second qubit 120 can be any type of qubit including, but not
limited to, superconducting transmon qubits, superconduct-
ing fluxonium qubits, superconducting multimode qubits
(e.g., superconducting tunable coupler qubits (TCQs)), spin
qubits, or other types of qubits that can be capacitively
coupled to a transmission line resonator of the coupling bus
130, etc. In some embodiments, the first qubit 110 and the
second qubit 120 comprise fixed-frequency qubits (not tun-
able). In other embodiments, the first qubit 110 and the
second qubit 120 comprise flux-tunable qubits with tunable
transition frequencies.

The quantum chip 102 further comprises a plurality of
control lines including, but not limited to, qubit drive lines
112 and 122, qubit readout resonators 114 and 124, and one
or more flux bias control lines 132 that are configured to
apply one or more flux bias control signals to the one or
more tunable inductive couplers of the coupling bus 130 to
mediate interactions between the first and second qubits 110
and 120, using techniques as discussed in further detail
below. In some embodiments, the qubit drive lines 112 and
122 are coupled (e.g., capacitively coupled) to the first and
second qubits 110 and 120, respectively. In some embodi-
ments, the qubit drive lines 112 and 122 are configured to
apply control signals (e.g., microwave control pulse signals)
to independently change the states of the respective first and
second qubits 110 and 120.

For example, a microwave control pulse can be applied to
the qubit drive line 112 to perform a single-qubit gate
operation on the first qubit 110 or otherwise modify the
computational state of the first qubit 110 as needed when
executing a quantum algorithm. Furthermore, a microwave
control pulse can be applied to the qubit drive line 122 to
perform a single-qubit gate operation on the second qubit
120 or otherwise modify the computational state of the
second qubit 120 as needed when executing a quantum
algorithm. As is known in the art, the state of a qubit can be
changed by applying a microwave control signal (e.g.,
control pulse) with a center frequency equal to a transition
frequency (denoted $f_{01}$) of the qubit, wherein the transition
frequency $f_{01}$ corresponds to an energy difference between
the ground state |0> and excited state |1> of the qubit. In
addition, the axis of rotation about a given axis of the Bloch
sphere (e.g., X-axis, Y-axis, or any axis in the X-Y plane)
and the amount (angle) of such rotation are based, respec-
tively, on the phase of the microwave control signal, and the
amplitude and duration of the microwave control signal.

Further, in some embodiments, the qubit readout resona-
tors 114 and 124 are dispersively coupled to the first and
second qubits 110 and 120, respectively, using known tech-
niques to perform dispersive readout operations. In some
embodiments, the qubit readout resonators 114 and 124
comprise transmission line readout resonators (e.g., coplanar
waveguide (CPW) resonators) which are configured to have
resonant frequencies that are detuned from the respective
transition frequencies of respective first and second qubits
110 and 120. In the dispersive regime of qubit-resonator
coupling, an RF readout control signal (with the requisite
frequency tone, pulse envelope shape, and pulse duration) is
applied to a given readout resonator of a given qubit-
resonator circuit, and interacts with the given qubit-resona-
tor circuit in a manner which results in the generation of a
readout signal that is reflected out from the given readout
resonator. The readout signal comprises information (e.g.,
phase and amplitude information) that is qubit-state depen-
dent. In this regard, a dispersive readout process yields an
RF readout signal having a state-dependent phasor response,
which is analyzed to discriminate the quantum state of the
given qubit, e.g., determine whether the readout state of the
given qubit is the ground state |0> or the first excited state
|1>, wherein for readout, a superposition state of the given
qubit is projected onto the ground state |0> or the first
excited state |1>, as is known in the art.

It is to be noted that the coupling bus 130 in FIG. 1 can
be implemented using various configurations of components
including transmission line resonators that are coupled
together using flux-tunable inductive couplers, or a combi-
nation of flux-tunable inductive couplers and fixed coupling
components (coupling capacitors and/or coupling induc-
tors). In general, each of the flux-tunable inductive couplers
can be implemented using any suitable superconducting
flux-tunable superconducting device having one or more
tunable inductive elements (e.g., one or more Josephson
junctions) that can be flux-tuned (via the control signals
applied to the flux bias control lines 132) into different
impedance states to control an amount of inductive coupling
between adjacent transmission line resonators of the cou-
pling bus 130. For example, in some embodiments, the
flux-tunable inductive couplers are implemented using radio
frequency superconducting quantum interference devices
(RF-SQUIDs). In other embodiments, the flux-tunable
inductive couplers are implemented using direct current
superconducting quantum interference devices (DC-
SQUIDs). In other embodiments, the flux-tunable inductive
couplers can be implemented using other types of flux-
tunable devices which comprise a superconducting loop
comprising one or more Josephson junctions which have
non-linear inductances that are modulated by an amount of
magnetic flux bias that threads through the superconducting
loop to change the inductance of the flux-tunable inductive
coupler. In this regard, various embodiments of the coupling
bus 130 will be discussed in further detail below in con-
junction with, e.g., FIGS. 2, 5, 6, 7, and 8.

Figure 2:
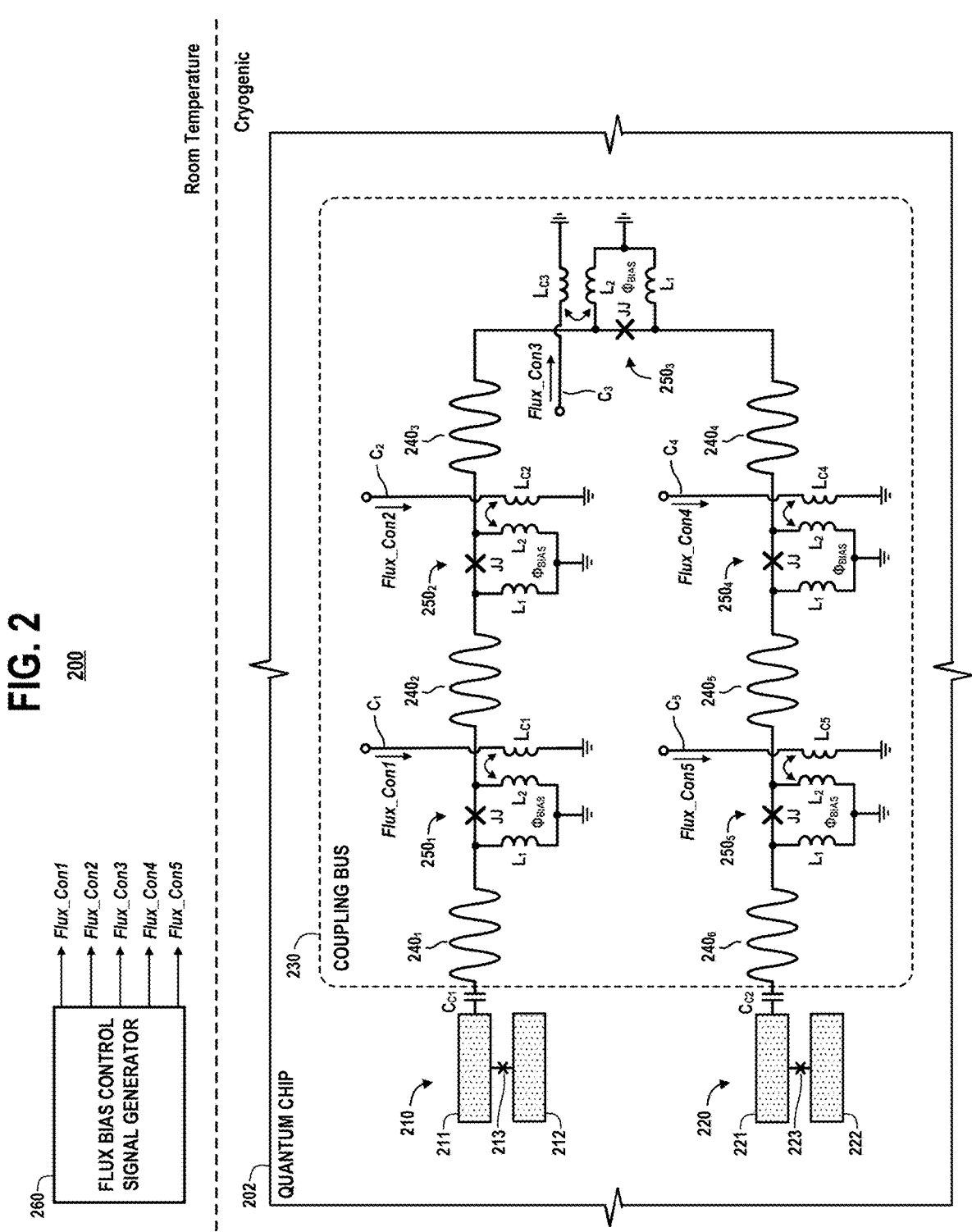
FIG. 2 schematically illustrates a system comprising a quantum device which comprises a coupling bus that is configured to mediate interactions between quantum bits, according to an exemplary embodiment of the disclosure.

For example, FIG. 2 schematically illustrates a system
comprising a quantum device which comprises a coupling
bus that is configured to mediate interactions between quan-
tum bits, according to an exemplary embodiment of the
disclosure. In particular, FIG. 2 schematically illustrates a
quantum system 200 which comprises a quantum chip 202
and various components disposed on the quantum chip 202,
where such components include, but are not limited to, a first
qubit 210, a second qubit 220, and a coupling bus 230 that
is coupled to and between the first and second qubits 210 and
220. In some embodiments, the first and second qubits 210 and 220 comprise fixed-frequency superconducting transmon qubits. In general, a transmon qubit comprises a Josephson junction and capacitor that are connected in parallel, wherein the Josephson junction functions as a non-linear inductor which, when shunted with the capacitor, forms an anharmonic LC oscillator with individually addressable energy levels (e.g., two lowest energy levels corresponding to the ground state |0⟩ and the first excited state |1⟩).

As schematically illustrated in FIG. 2, the first qubit 210 comprises a first superconducting pad 211, a second superconducting pad 212, and a Josephson junction 213 that is coupled to, and disposed between, the first and second superconducting pads 211 and 212. The first and second superconducting pads 211 and 212 comprise electrodes of a coplanar capacitor structure which is connected in parallel with the Josephson junction 213 to form a transmon-type qubit. Similarly, the second qubit 220 comprises a first superconducting pad 221, a second superconducting pad 222, and a Josephson junction 223 that is coupled to, and disposed between, the first and second superconducting pads 221 and 222. The first and second superconducting pads 221 and 222 comprise electrodes of a coplanar capacitor structure which is connected in parallel with the Josephson junction 223 to form a transmon-type qubit.

The coupling bus 230 comprises a plurality of transmission line resonators $240_1$, $240_2$, $240_3$, $240_4$, $240_5$, and $240_6$, and a plurality of flux-tunable inductive couplers $250_1$, $250_2$, $250_3$, $250_4$, and $250_5$. The transmission line resonators $240_1$, $240_2$, $240_3$, $240_4$, $240_5$, and $240_6$, and the flux-tunable inductive couplers $250_1$, $250_2$, $250_3$, $250_4$, $250_5$, and $250_6$ are serially connected in an alternating manner to form the coupling bus 230 between the first and second qubits 210 and 220. In particular, as schematically shown in FIG. 2, the first qubit 210 is capacitively coupled (via a coupling capacitor $C_{C1}$) to the first transmission line resonator $240_1$. The first transmission line resonator $240_1$ and the second transmission line resonator $240_2$ are coupled by the first flux-tunable inductive coupler $250_1$. The second transmission line resonator $240_2$ and the third transmission line resonator $240_3$ are coupled by the second flux-tunable inductive coupler $250_2$. The third transmission line resonator $240_3$ and the fourth transmission line resonator $240_4$ are coupled by the third flux-tunable inductive coupler $250_3$. The fourth transmission line resonator $240_4$ and the fifth transmission line resonator $240_5$ are coupled by the fourth flux-tunable inductive coupler $250_4$. The fifth transmission line resonator $240_5$ and the sixth transmission line resonator $240_6$ are coupled by the fifth flux-tunable inductive coupler $250_5$. The second qubit 220 is capacitively coupled (via a coupling capacitor $C_{C2}$) to the sixth transmission line resonator $240_6$. The coupling capacitors $C_{C1}$ and $C_{C2}$ can be implemented using suitable capacitive coupling structures and techniques known to those of ordinary skill in the art.

In some embodiments, the transmission line resonators $240_1$, $240_2$, $240_3$, $240_4$, $240_5$, and $240_6$ comprise nominally identical CPW resonators which have the same electrical length. In some embodiments, the transmission line resonators $240_1$, $240_2$, $240_3$, $240_4$, $240_5$, and $240_6$ each comprise an open-circuited half-wavelength ($\lambda/2$) transmission line resonator with a length $l=(n\times\lambda)/2$, wherein n denotes a resonant mode number (n=1, 2, 3, . . . ). In a non-limiting exemplary embodiment, the transmission line resonators $240_1$, $240_2$, $240_3$, $240_4$, $240_5$, and $240_6$ each have a resonator length of approximately 4.1 millimeters (mm) and a fundamental resonant frequency of about 6.0 GHz. In some embodiments, the transmission line resonators $240_1$, $240_2$, $240_3$, $240_4$, $240_5$, and $240_6$ are configured to have a same nominal resonant frequency which is greater than the transition frequencies of the first and second qubits 210 and 220. In other embodiments, the transmission line resonators $240_1$, $240_2$, $240_3$, $240_4$, $240_5$, and $240_6$ are configured to have a same nominal resonant frequency which is less than the transition frequencies of the first and second qubits 210 and 220.

The quantum system 200 further comprises a flux bias control signal generator 260 which is configured to generate a plurality of flux bias control signals, Flux_Con1, Flux_Con2, Flux_Con3, Flux_Con4, and Flux_Con5 for controlling the flux-tunable inductive couplers $250_1$, $250_2$, $250_3$, $250_4$, and $250_5$, respectively, to thereby control the operation of the coupling bus 230 for mediating interactions between the first and second qubits 210 and 220. As schematically illustrated in FIG. 2, the flux-tunable inductive couplers $250_1$, $250_2$, $250_3$, $250_4$, and $250_5$ are disposed adjacent to respective coupling inductors $L_{C1}$, $L_{C2}$, $L_{C3}$, $L_{C4}$, and $L_{C5}$. Each coupling inductor $L_{C1}$, $L_{C2}$, $L_{C3}$, $L_{C4}$, and $L_{C5}$ is connected in series (inline) with a respective control line $C_1$, $C_2$, $C_3$, $C_4$, and $C_5$. The flux bias control signals Flux_Con1, Flux_Con2, Flux_Con3, Flux_Con4, and Flux_Con5 are applied to the respective control lines $C_1$, $C_2$, $C_3$, $C_4$, and $C_5$. In some embodiments, the flux bias control signals Flux_Con1, Flux_Con2, Flux_Con3, Flux_Con4, and Flux_Con5 comprise control currents which flow through the respective coupling inductors $L_{C1}$, $L_{C2}$, $L_{C3}$, $L_{C4}$, and $L_{C5}$ to generate magnetic fluxes (denoted $\Phi_{BIAS}$) for tuning the flux-tunable inductive couplers $250_1$, $250_2$, $250_3$, $250_4$, and $250_5$ into desired operating states.

In particular, each flux-tunable inductive coupler $250_1$, $250_2$, $250_3$, $250_4$, and $250_5$ comprises a superconducting loop which comprises at least one Josephson junction having a non-linear inductance that is modulated by a magnetic flux bias $\Phi_{BIAS}$ which threads through the superconducting loop to change the inductance and thereby selectively place a flux-tunable inductive coupler into one of two different operating states, which are referred to herein as an "ON state" and an "OFF state." In some embodiments, as schematically illustrated in FIG. 2, the flux-tunable inductive couplers $250_1$, $250_2$, $250_3$, $250_4$, and $250_5$ comprise nominally identical RF-SQUIDs, where each RF-SQUID comprises a series Josephson junction JJ, a first superconducting inductor L1, and a second superconducting inductor L2, which are connected to form a superconducting loop through which a given magnitude of magnetic flux bias $\Phi_{Bias}$ is threaded to selectively place the RF-SQUID into an ON state or an OFF state.

For example, to place a given flux-tunable inductive coupler into an ON state, a flux bias control signal is applied to the associated control line to cause a first amount of magnetic flux bias $\Phi_{Bias}$ to thread through the superconducting loop of the given flux-tunable inductive coupler and place the given flux-tunable inductive coupler into a first inductance state in which the given flux-tunable inductive coupler is activated (placed into ON state) to turn on a coupling between adjacent transmission line resonators coupled to the given flux-tunable inductive coupler. On the other hand, to place the given flux-tunable inductive coupler into an OFF state, a flux bias control signal is applied to the associated control line to cause a second amount of magnetic flux bias $\Phi_{Bias}$ to thread through the superconducting loop of the given flux-tunable inductive coupler and place the given flux-tunable inductive coupler into a second inductance state in which the given flux-tunable inductive coupler is deactivated (placed into OFF state) to turn off an inductive coupling between the adjacent transmission line resonators coupled to the given flux-tunable inductive coupler.

More specifically, in the exemplary configuration of the coupling bus 230 shown in FIG. 2, the transmission line resonators $240_1$, $240_2$, $240_3$, $240_4$, $240_5$, and $240_6$ are designed to have nominally identical resonator lengths, wherein the resonator length is selected so that each transmission line resonator $240_1$, $240_2$, $240_3$, $240_4$, $240_5$, and $240_6$ has a nominally identical resonant frequency and frequency range, when the flux-tunable inductive couplers $250_1$, $250_2$, $250_3$, $250_4$, and $250_5$ are tuned in an OFF state. When all flux-tunable inductive couplers $250_1$, $250_2$, $250_3$, $250_4$, and $250_5$ are tuned in the OFF state, there is no inductive coupling between any adjacent pairs of the transmission line resonators $240_1$, $240_2$, $240_3$, $240_4$, $240_5$, and $240_6$ and, consequently, the coupling bus 230 is in an OFF state in which there is no coupling (e.g., no exchange coupling) between the first qubit 210 and the second qubit 220. With the coupling bus 230 in an OFF state, the exchange coupling (or residual ZZ coupling) between the first and second qubits 210 and 220 is significantly suppressed.

On the other hand, when all flux-tunable inductive couplers $250_1$, $250_2$, $250_3$, $250_4$, and $250_5$ are tuned into an ON state, the flux-tunable inductive couplers $250_1$, $250_2$, $250_3$, $250_4$, and $250_5$ provide inductive coupling between adjacent pairs of the transmission line resonators $240_1$, $240_2$, $240_3$, $240_4$, $240_5$, and $240_6$. The inductive coupling through the flux-tunable inductive couplers $250_1$, $250_2$, $250_3$, $250_4$, and $250_5$ causes the individual modes of the transmission line resonators $240_1$, $240_2$, $240_3$, $240_4$, $240_5$, and $240_6$ to hybridize with each other, thereby resulting in one of the normal modes of the hybridized resonators to move toward the transition frequencies of the first and second qubits 210 and 220 which, in turn, significantly increases the exchange coupling between the first and second qubits 210 and 220, e.g., significantly increasing the ZZ interaction between the first and second qubits 210 and 220 through the coupling bus 230. The strong ZZ interaction through the coupling bus 230 enables a fast two-qubit gate operation (e.g., Controlled-Phase gate) between the first and second qubit 210 and 220.

It is to be noted that the operating mode of the coupling bus 230 will vary depending on the transition frequencies of the first and second qubits 210 and 220 and the normal frequency modes of the transmission line resonators $240_1$, $240_2$, $240_3$, $240_4$, $240_5$, and $240_6$. For example, in some embodiments, the transmission line resonators $240_1$, $240_2$, $240_3$, $240_4$, $240_5$, and $240_6$ are designed to have a nominally identical resonant frequency which is greater than the respective transition frequencies of the first and second qubits 210 and 220. In other embodiments, the transmission line resonators $240_1$, $240_2$, $240_3$, $240_4$, $240_5$, and $240_6$ are designed to have a nominally identical resonant frequency which is less than the respective transition frequencies of the first and second qubits 210 and 220. Furthermore, the manner in which the flux-tunable inductive couplers $250_1$, $250_2$, $250_3$, $250_4$, and $250_5$ are tuned into ON and OFF states to control and mediate the exchange coupling (e.g., ZZ interaction) between the first and second qubits 210 and 220 through the coupling bus 230 will vary depending on whether the normal mode resonant frequency of each transmission line resonator $240_1$, $240_2$, $240_3$, $240_4$, $240_5$, and $240_6$ is greater than or less than the respective transition frequencies of the first and second qubits 210 and 220.

For example, in the exemplary embodiment of FIG. 2 where the flux-tunable inductive couplers $250_1$, $250_2$, $250_3$, $250_4$, and $250_5$ comprise nominally identical RF-SQUIDS, each flux-tunable inductive coupler $250_1$, $250_2$, $250_3$, $250_4$, and $250_5$ can be placed into an OFF state by applying a magnetic flux bias ($F_{Bias}$ through the superconducting loop of the RF-SQUID, which has a magnitude of $\Phi_{BIAS}=x \, \Phi_0$, where x is a value between 0 and 0.5, and where $\Phi_0$ denotes the magnetic flux quantum $\Phi_0=h/2e$ (where h denotes the Planck constant and e denotes the elementary charge constant). In an exemplary non-limiting embodiment, the flux-tunable inductive couplers $250_1$, $250_2$, $250_3$, $250_4$, and $250_5$ can be designed such that a given flux-tunable inductive coupler is placed into an OFF state by applying a magnetic flux bias of $\Phi_{BIAS} \approx 0.25 \, \Phi_0$ through the superconducting loop thereof. As noted above, when a given flux-tunable inductive coupler is placed into an OFF state, there is no inductive coupling between adjacent transmission line resonators coupled to the given flux-tunable inductive coupler.

It is to be noted that the precise amount of magnetic flux bias $\Phi_{BIAS}$ to place a given flux-tunable inductive coupler (implemented as an RF-SQUID) into an OFF state corresponds to the amount of magnetic flux bias $\Phi_{BIAS}$ which results in no (zero) inductive coupling across the single Josephson junction JJ of the RF-SQUID, wherein the precise value depends on the size of the Josephson junction JJ and the size of the inductors L1 and L2 where a net-zero inductive coupling is achieved where the inductance of the Josephson junction JJ cancels out the geometric inductance of the RF SQUID (where the geometric inductance is based in part on the shape and dimensions of the superconducting SQUID loop). In some embodiments, the RF-SQUIDs that implement the flux-tunable inductive couplers $250_1$, $250_2$, $250_3$, $250_4$, and $250_5$ are designed to have an OFF state in response to a magnetic flux bias of $\Phi_{BIAS} \approx 0.25 \, \Phi_0$.

On the other hand, a given flux-tunable inductive coupler can be placed into an ON state by either increasing the magnetic flux bias to a magnitude of $\Phi_{BIAS} > 0.25$ (Do or decreasing the magnetic flux bias to a magnitude of $\Phi_{BIAS} < 0.25$ (Do, depending on whether the nominally identical resonant frequency of the transmission line resonators $240_1$, $240_2$, $240_3$, $240_4$, $240_5$, and $240_6$ is greater than or less than the transition frequencies of the first and second qubits 210 and 220. In particular, in embodiments where the normal mode resonant frequency of the transmission line resonators $240_1$, $240_2$, $240_3$, $240_4$, $240_5$, and $240_6$ is greater than the transition frequencies of the first and second qubits 210 and 220, a given flux-tunable inductive coupler can be placed into an ON state by increasing the magnetic flux bias $\Phi_{BIAS}$ to a magnitude of $\Phi_{BIAS} \approx 0.5 \, \Phi_0$. On the other hand, in embodiments where the normal mode resonant frequency of the transmission line resonators $240_1$-$240_6$ is less than the transition frequencies of the first and second qubits 210 and 220, a given flux-tunable inductive coupler can be placed into an ON state by decreasing the magnetic flux bias $\Phi_{BIAS}$ to a magnitude of $\Phi_{BIAS} \approx 0$.

By way of example, assume that that the transmission line resonators $240_1$, $240_2$, $240_3$, $240_4$, $240_5$, and $240_6$ are each designed to have a normal mode resonant frequency of 6.0 GHz, and that the first and second qubits 210 and 220 are designed to have respective transition frequencies in a range of 4.5 GHz to 5.5 GHz. Depending on the location of the first and second qubits 210 and 220 in a given qubit array on the quantum chip 202, the first and second qubits 210 and 220 can be designed to have the same transition frequency or different transition frequencies, where the transition frequencies are selected to avoid frequency collisions within the given qubit array, as is understood by those of ordinary skill in the art. In this exemplary configuration, the coupling bus 230 can be turned ON to achieve a strong exchange coupling between the first and second qubits 210 and 220 by applying a magnetic flux bias of $\Phi_{BIAS} \approx 0.5$ (Do to each of the flux-tunable inductive couplers 250$_1$, 250$_2$, 250$_3$, 250$_4$, and 250$_5$ to thereby place each flux-tunable inductive coupler 250$_1$, 250$_2$, 250$_3$, 250$_4$, and 250$_5$ into an ON state and turn on the inductive coupling between the transmission line resonators 240$_1$, 240$_2$, 240$_3$, 240$_4$, 240$_5$, and 240$_6$ of the coupling bus 230.

In this exemplary configuration, placing each of the flux-tunable inductive couplers 250$_1$, 250$_2$, 250$_3$, 250$_4$, and 250$_5$ into an ON state serves to enable inductive coupling between the transmission line resonators 240$_1$, 240$_2$, 240$_3$, 240$_4$, 240$_5$, and 240$_6$ over the coupling bus 230 which, in turn, causes the normal modes of the transmission line resonators 240$_1$, 240$_2$, 240$_3$, 240$_4$, 240$_5$, and 240$_6$ to be hybridized. As a result of mode hybridization, one of the normal modes (e.g., lowest frequency mode) of the hybridized transmission line resonators 240$_1$, 240$_2$, 240$_3$, 240$_4$, 240$_5$, and 240$_6$ moves down in frequency (e.g., lowest hybridized frequency mode) towards the transition frequencies of the first and second qubits 210 and 220, which results in a strong exchange coupling between the first and second qubits 210 and 220 via the coupling bus 230.

By way of example, assuming the transmission line resonators 240$_1$, 240$_2$, 240$_3$, 240$_4$, 240$_5$, and 240$_6$ have a resonant frequency of 6.0 GHz, and the first and second qubits 210 and 220 each have a transition frequency of 5.0 GHz, the lowest hybridized frequency mode of the transmission line resonators 240$_1$, 240$_2$, 240$_3$, 240$_4$, 240$_5$, and 240$_6$ (which is generated as a result of the inductive coupling) can be around 5.1 GHz. In this instance, the qubit-resonator exchange coupling is about 100 MHz. Moreover, the other hybridized modes (higher frequency modes) of the transmission line resonators 240$_1$, 240$_2$, 240$_3$, 240$_4$, 240$_5$, and 240$_6$ will remain above, e.g., 7.0 GHz. As such, the higher frequency hybridized modes will not dephase the first and second qubits 210 and 220. In addition, the higher frequency hybridized modes are less likely to be thermally populated in the typical cryogenic temperature environments of dilution refrigerators.

In other embodiments, as noted above, the coupling bus 230 can be designed where normal mode resonant frequency of the transmission line resonators 240$_1$-240$_6$ is less than the transition frequencies of the first and second qubits 210 and 220. By way of example, assuming that first and second qubits 210 and 220 each have a transition frequency of 5.0 GHz, the transmission line resonators 240$_1$, 240$_2$, 240$_3$, 240$_4$, 240$_5$, and 240$_6$ can be designed to have nominally identical resonant frequency in a range of 3.5 GHz to 4.0 GHz. In this exemplary configuration, the coupling bus 230 can be turned ON to achieve a strong exchange coupling between the first and second qubits 210 and 220 by applying a magnetic flux bias of $\Phi_{BIAS} \approx 0 \ \Phi_0$ to each of the flux-tunable inductive couplers 250$_1$, 250$_2$, 250$_3$, 250$_4$, and 250$_5$ to thereby place each flux-tunable inductive coupler 250$_1$, 250$_2$, 250$_3$, 250$_4$, and 250$_5$ into an ON state and turn on the inductive coupling between the transmission line resonators 240$_1$, 240$_2$, 240$_3$, 240$_4$, 240$_5$, and 240$_6$ of the coupling bus 230.

In this exemplary configuration, placing each of the flux-tunable inductive couplers 250$_1$, 250$_2$, 250$_3$, 250$_4$, and 250$_5$ into an ON state serves to enable inductive coupling between the transmission line resonators 240$_1$, 240$_2$, 240$_3$, 240$_4$, 240$_5$, and 240$_6$ over the coupling bus 230 which, in turn, causes the normal modes of the transmission line resonators 240$_1$, 240$_2$, 240$_3$, 240$_4$, 240$_5$, and 240$_6$ to be hybridized. As a result of mode hybridization, one of the normal modes of the hybridized transmission line resonators 240$_1$, 240$_2$, 240$_3$, 240$_4$, 240$_5$, and 240$_6$ moves up in frequency (e.g., highest frequency hybridized mode) towards the transition frequencies of the first and second qubits 210 and 220, which results in a strong exchange coupling between the first and second qubits 210 and 220 via the coupling bus 230. For example, a highest frequency hybridized mode of the transmission line resonators 240$_i$, 240$_2$, 240$_3$, 240$_4$, 240$_5$, and 240$_6$ (which is generated as a result of the inductive coupling) can be around 4.9 or 5.0 GHz.

In some embodiments, a two-qubit gate operation can be performed by a process which comprises (i) concurrently placing each flux-tunable inductive coupler 250$_1$, 250$_2$, 250$_3$, 250$_4$, and 250$_5$ into an ON state to turn ON the coupling bus 230 and enable strong exchange coupling (e.g., ZZ interaction) between the first and second qubits 210 and 220 over the coupling bus 230, and (ii) concurrently placing each flux-tunable inductive couplers 250$_1$, 250$_2$, 250$_3$, 250$_4$, and 250$_5$ into an OFF state to complete a two-qubit gate operation and turn OFF the coupling bus 230 to suppress exchange coupling (e.g., ZZ interaction) between the first and second qubits 210 and 220 over the coupling bus 230. In other embodiments, a two-qubit gate operation can be performed by a process which comprises tuning the flux-tunable inductive couplers 250$_1$, 250$_2$, 250$_3$, 250$_4$, and 250$_5$ into ON and OFF states according a specified ON and OFF sequence, which serves to prevent or otherwise suppress interaction between the modes of the coupling bus 230 and the qubit readout resonators of the first and second qubits 210 and 220 (not specifically shown in FIG. 2). In the regime of dispersive readout of qubit states, the qubit readout resonators (e.g., qubit readout resonators 114 and 124, FIG. 1) are configured to have resonant frequencies that are detuned from the respective transition frequencies of the respective first and second qubits 210 and 220. For example, assuming the first and second qubits 210 and 220 each have a transition frequency of 5.0 GHz, the associated readout resonators can each be designed to have a resonant frequency of about 7.0 GHz, which is well detuned from the transition frequency of the first and second qubits 210 and 220.

FIG. 3 illustrates a flow diagram of a method for utilizing a coupling bus to mediate interactions between quantum bits, according to an exemplary embodiment of the disclosure. In particular, FIG. 3 illustrates a flow diagram of a method 300 to perform a two-qubit gate operation using the exemplary coupling bus 230 of FIG. 2 where the flux-tunable inductive couplers 250$_1$, 250$_2$, 250$_3$, 250$_4$, and 250$_5$ are tuned into ON and OFF states according specified ON and OFF sequences to prevent or otherwise suppress interaction between the modes of the coupling bus 230 and readout resonators of the first and second qubits 210 and 220. The method 300 involves tuning the flux-tunable inductive couplers 250$_1$, 250$_2$, 250$_3$, 250$_4$, and 250$_5$ into ON states in stages (blocks 301 and 302), followed by tuning the flux-tunable inductive couplers 250$_1$, 250$_2$, 250$_3$, 250$_4$, and 250$_5$ into OFF states in stages (blocks 303 and 304).

In particular, to commence a two-qubit gate operation, starting with each flux-tunable inductive coupler 250$_1$, 250$_2$, 250$_3$, 250$_4$, and 250$_5$ in an OFF state (deactivated), an initial step involves placing each flux-tunable inductive coupler in the middle (interior) portion of the coupling bus 230 into an ON state to enable coupling of the transmission line resonators in the middle portion of the coupling bus 230, while maintaining the first and second qubits 210 and 220 decoupled from the coupling bus 230 (block 301). For example, in the exemplary embodiment of FIG. 2, the initial step involves placing the flux-tunable inductive couplers $250_2$, $250_3$, and $250_4$ into an ON state, while initially leaving the flux-tunable inductive couplers $250_1$ and $250_5$ in an OFF state.

The initial step (block 301) results in the inductive coupling of the transmission line resonators $240_2$, $240_3$, $240_4$, and $240_5$ (through the flux-tunable inductive couplers $250_2$, $250_3$, and $250_4$ in the ON states), which, in turn, causes the normal modes of the inductively-coupled transmission line resonators $240_2$, $240_3$, $240_4$, and $240_5$ to be hybridized as discussed above, where as a result of mode hybridization, one of the normal modes (e.g., lowest frequency mode) of the hybridized transmission line resonators $240_2$, $240_3$, $240_4$, and $240_5$ moves down in frequency (e.g., lowest hybridized frequency mode) towards the transition frequencies of the first and second qubits 210 and 220. Moreover, with this initial step (block 301), the flux-tunable inductive couplers $250_1$ and $250_5$ that are adjacent to the respective first and second qubits 210 and 220 are initially kept in the OFF state to prevent coupling between the qubit readout resonators and the coupling bus modes through the first and second qubits 210 and 220 themselves.

Next, after some time when it is expected that the unused hybridized modes of the coupling bus 230 are above the resonator frequencies of the qubit readout resonators, the process proceeds to place each flux-tunable inductive coupler (e.g., flux-tunable inductive couplers $250_1$ and $250_5$) at the ends of the coupling bus 230 into an ON state to thereby enable exchange coupling between the first and second qubits 210 and 220 over the fully turned ON coupling bus 230 to perform a two-qubit gate operation (block 302). This process causes the modes of the transmission line resonators $240_1$ and $240_6$ (which are coupled to the first and second qubits 210 and 220) to hybridize and cause the lowest frequency mode of the coupling bus 230 to, e.g., move down towards the transition frequencies of the first and second qubits 210 and 220, thereby increasing the exchange coupling (e.g., ZZ interaction) between the first and second qubits 210 and 220 to perform a two-qubit gate operation.

The two-qubit gate operation can be, e.g., a Controlled-Phase gate operation (CPHASE gate) in which a phase shift is applied to a target qubit when a control qubit is in a first excited state |1>. In other embodiments, when the first and second qubits 210 and 220 are close in frequency, the two-qubit gate operation can be a SWAP gate operation in which the state of the first qubit 210 becomes the state of the second qubit 220, and vice versa, or any other type of parametric entanglement gate operation that can be implemented the exemplary long-range qubit coupling architectures as discussed herein.

Upon completion of the gate operation, the first and second qubits 210 and 220 are decoupled by placing the flux-tunable inductive couplers $250_2$, $250_3$, and $250_4$ into OFF states using a turn OFF sequence which is opposite (reverse order) to the turn ON sequence. More specifically, to terminate the gate operation and decouple the first and second qubits 210 and 220, an initial step involves placing each flux-tunable inductive coupler (e.g., flux-tunable inductive couplers $250_1$ and $250_5$) at the ends of the coupling bus 230 into an OFF state to suppress (or turn off) the exchange coupling between the first and second qubits 210 and 220 over the coupling bus 230 (block 303), which is then followed by placing each of the remaining flux-tunable inductive couplers $250_2$, $250_3$, and $250_4$ (in the middle portion of the coupling bus 230) into an OFF state (block 304), resulting in decoupling to an ON state, which results in decoupling the transmission line resonators $240_1$, $240_2$, $240_3$, $240_4$, $240_5$, and $240_6$ from each other and, thus, significantly suppressing (or otherwise eliminating) any residual ZZ interaction between the first and second qubits 210 and 220 over the coupling bus 230.

Figure 4:
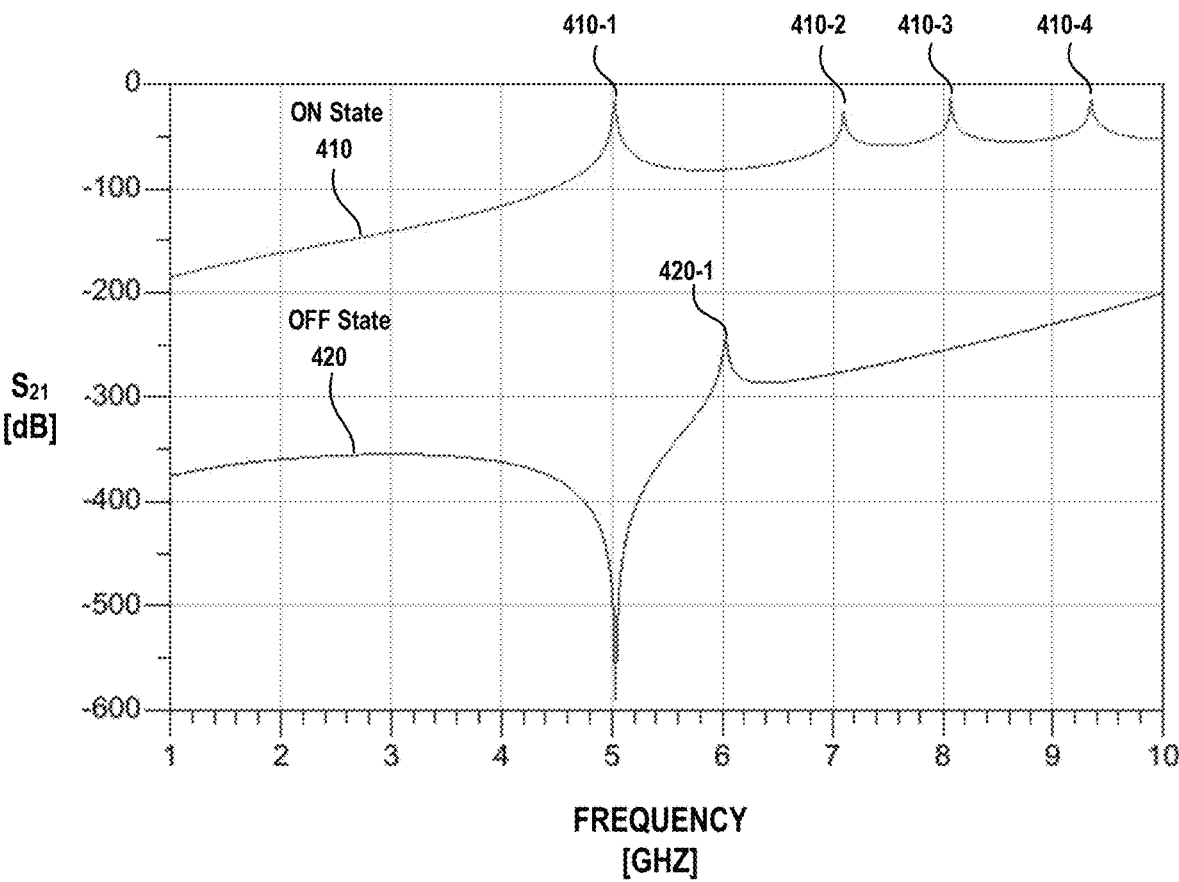
FIG. 4 depicts simulated scattering parameters with regard to signal transmission between qubits over a coupling bus, according to an exemplary embodiment of the disclosure.

FIG. 4 depicts simulated scattering parameters with regard to signal transmission between qubits over a coupling bus, according to an exemplary embodiment of the disclosure. In particular, FIG. 4 depicts simulated $S_{21}$ scattering parameters 400 of a computer simulated coupling bus having an exemplary architecture as shown in FIG. 2, where the flux-tunable inductive couplers $250_1$, $250_2$, $250_3$, $250_4$, and $250_5$ are modeled as RF-SQUIDs with a superconducting loop inductance L~0.5 nH, the first and second qubits 210 and 220 are modeled as transmon qubits with transition frequencies of 5 GHz, and the transmission line resonators $240_1$, $240_2$, $240_3$, $240_4$, $240_5$, and $240_6$ are modeled as CPW resonators with lengths of 4.1 mm.

FIG. 4 illustrates (i) a first curve 410 which represents the simulated $S_{21}$ parameters of signal transmission over the coupling bus between the first and second transmon qubits for a frequency range of 1.0 GHz to 10.0 GHz, with the coupling bus in an ON state, and (ii) a second curve 420 which represents the simulated $S_{21}$ parameters of signal transmission over the coupling bus between the first and second transmon qubits for the frequency range of 1.0 GHz to 10.0 GHz, with the coupling bus in an OFF state. In the ON state of the coupling bus, all the flux-tunable inductive couplers $250_1$, $250_2$, $250_3$, $250_4$, and $250_5$ are tuned in an ON state. In the OFF state of the coupling bus, all the flux-tunable inductive couplers $250_1$, $250_2$, $250_3$, $250_4$, and $250_5$ are tuned in an OFF state.

The second curve 420 comprises a point 420-1 which illustrates a peak $S_{21}$ transmission at a fundamental resonant frequency mode of 6.0 GHz of the CPW resonators, when the coupling bus is in an OFF state (with all the flux-tunable inductive couplers $250_1$, $250_2$, $250_3$, $250_4$, and $250_5$ in an OFF state). On the other hand, the first curve 410 comprises various points 410-1, 410-2, 410-3, and 410-4 which illustrate peak $S_{21}$ transmissions at different hybridized frequency modes of the CPW resonators, when the coupling bus is in an ON state (with all the flux-tunable inductive couplers $250_1$, $250_2$, $250_3$, $250_4$, and $250_5$ in an ON state). In particular, a first point 410-1 illustrates a peak $S_{21}$ transmission at the lowest hybridized frequency mode of 5.1 GHz, which enables exchange interaction between the first and second qubits over the coupling bus. In addition, the first curve 410 comprises a second point 410-2 which illustrates a peak $S_{21}$ transmission at a higher hybridized frequency mode of about 7.1 GHz, a third point 410-3 which illustrates a peak $S_{21}$ transmission at a higher hybridized frequency mode of about 8.1 GHz, and a fourth point 410-3 which illustrates a peak $S_{21}$ transmission at a higher hybridized frequency mode of about 9.3 GHz. The higher hybridized frequency modes represented by the second, third, and fourth points 410-2, 410-3, and 410-4 do not enable exchange interaction between the first and second qubits over the coupling bus.

While FIG. 2 illustrates an exemplary configuration of a long-range coupling bus comprising five (5) flux-tunable inductive couplers and six (6) transmission line resonators, it is to be understood that a long-range coupling bus can be constructed using any suitable number of flux-tunable inductive couplers and transmission line resonators, depending on, e.g., the distance of a desired coupling path between two qubits within a given qubit lattice which need to be coupled together.

Figure 5:
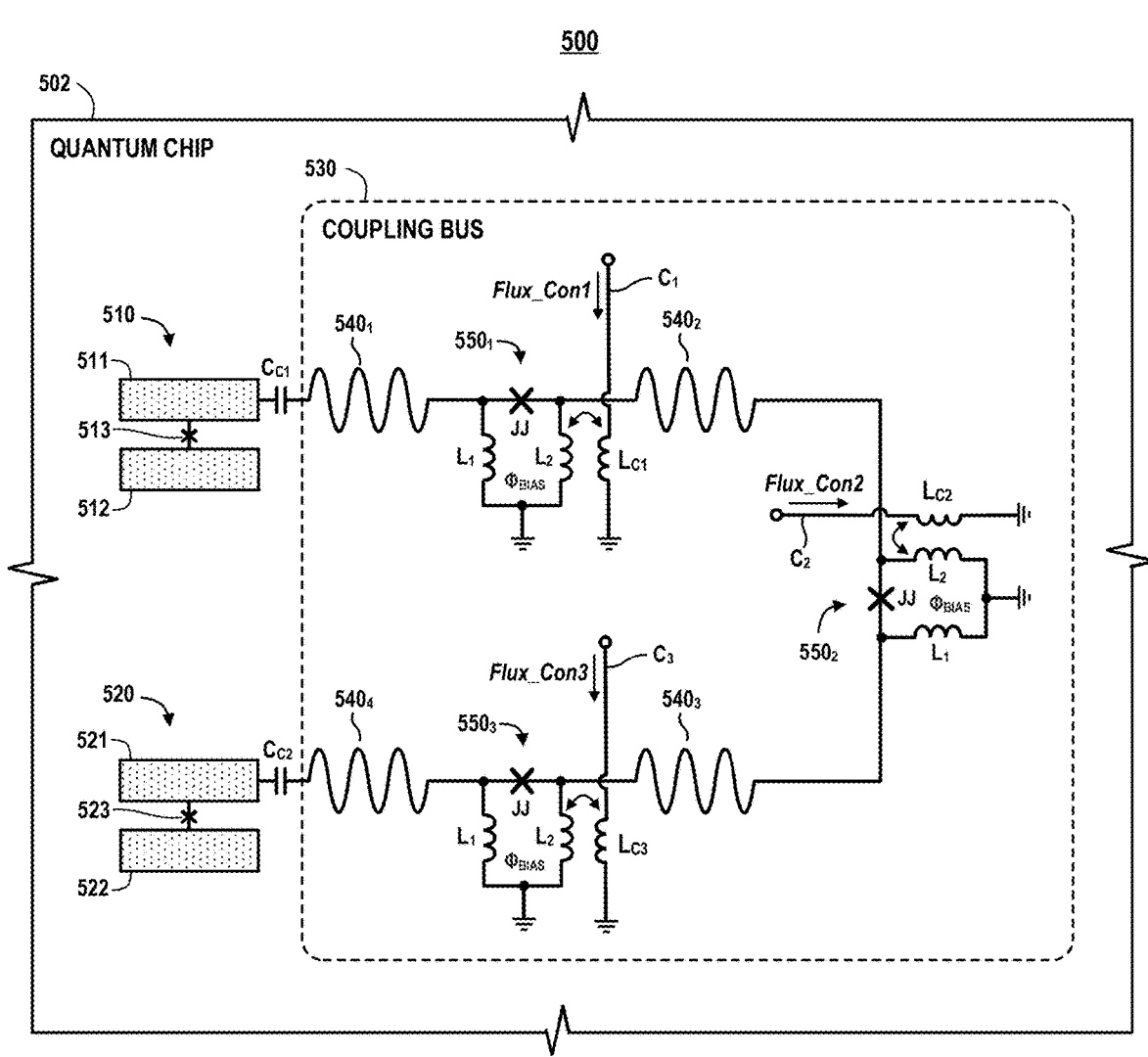
FIG. 5 schematically illustrates a device which comprises a coupling bus that is configured to mediate interactions between quantum bits, according to another exemplary embodiment of the disclosure.

For example, FIG. 5 schematically illustrates a device which comprises a coupling bus that is configured to mediate interactions between quantum bits, according to another exemplary embodiment of the disclosure. In particular, FIG. 5 schematically illustrates a device 500 which comprises a quantum chip 502 and various components disposed on the quantum chip 502, where such components include, but are not limited to, a first qubit 510, a second qubit 520, and a coupling bus 530 that is coupled to and between the first and second qubits 510 and 520. In some embodiments, the first and second qubits 510 and 520 comprise fixed-frequency superconducting transmon qubits, wherein the first qubit 510 comprises a first superconducting pad 511, a second super-conducting pad 512, and a Josephson junction 513, and the second qubit 520 comprises a first superconducting pad 521, a second superconducting pad 522, and a Josephson junction 523.

The coupling bus 530 comprises a plurality (four) of transmission line resonators $540_1$, $540_2$, $540_3$, and $540_4$ (e.g., CPW resonators), and a plurality (three) of flux-tunable inductive couplers $550_1$, $550_2$, and $550_3$ (e.g., RF-SQUIDs). The coupling bus 530 is similar in structure and operation as the coupling bus 230 discussed above in conjunction with FIG. 2 (the details of which will not be repeated), except that the coupling bus 530 comprises a smaller number of trans-mission line resonators and flux-tunable inductive couplers, to enable long-range coupling of the first and second qubits 510 and 520.

In other embodiments, a coupling bus can be constructed with two flux-tunable inductive couplers and three transmis-sion line resonators. For example, the exemplary coupling bus 530 of FIG. 5 can be modified by replacing the trans-mission line resonators $540_2$ and $540_3$, and the flux-tunable inductive coupler $550_3$ with a single transmission line reso-nators that is coupled to and between the flux-tunable inductive couplers $550_1$ and $550_3$. In other embodiments, the coupling bus 230 of FIG. 2 can be modified by adding one or more additional flux-tunable inductive couplers and trans-mission line resonators to construct a longer-range coupling comprising an alternating sequence of six (6) flux-tunable inductive couplers and seven (7) transmission line resona-tors, etc.

In this regard, it is to be noted that various exemplary embodiments of long-range coupling buses are constructed using multiple smaller lengths of transmission line resona-tors (e.g., multiple CPW segments) instead of one or two long transmission line resonators, to limit the number of low frequency modes. Advantageously, the use of multiple smaller-length transmission line resonators serves to custom tailor the mode structure of the coupling bus so that only one hybridized frequency mode, which is close to the transition frequencies of the qubits, is generated on the coupling bus to enable exchange coupling between the qubits, while all other hybridized frequency modes are detuned far from the transition frequencies of the qubits.

Figure 6:
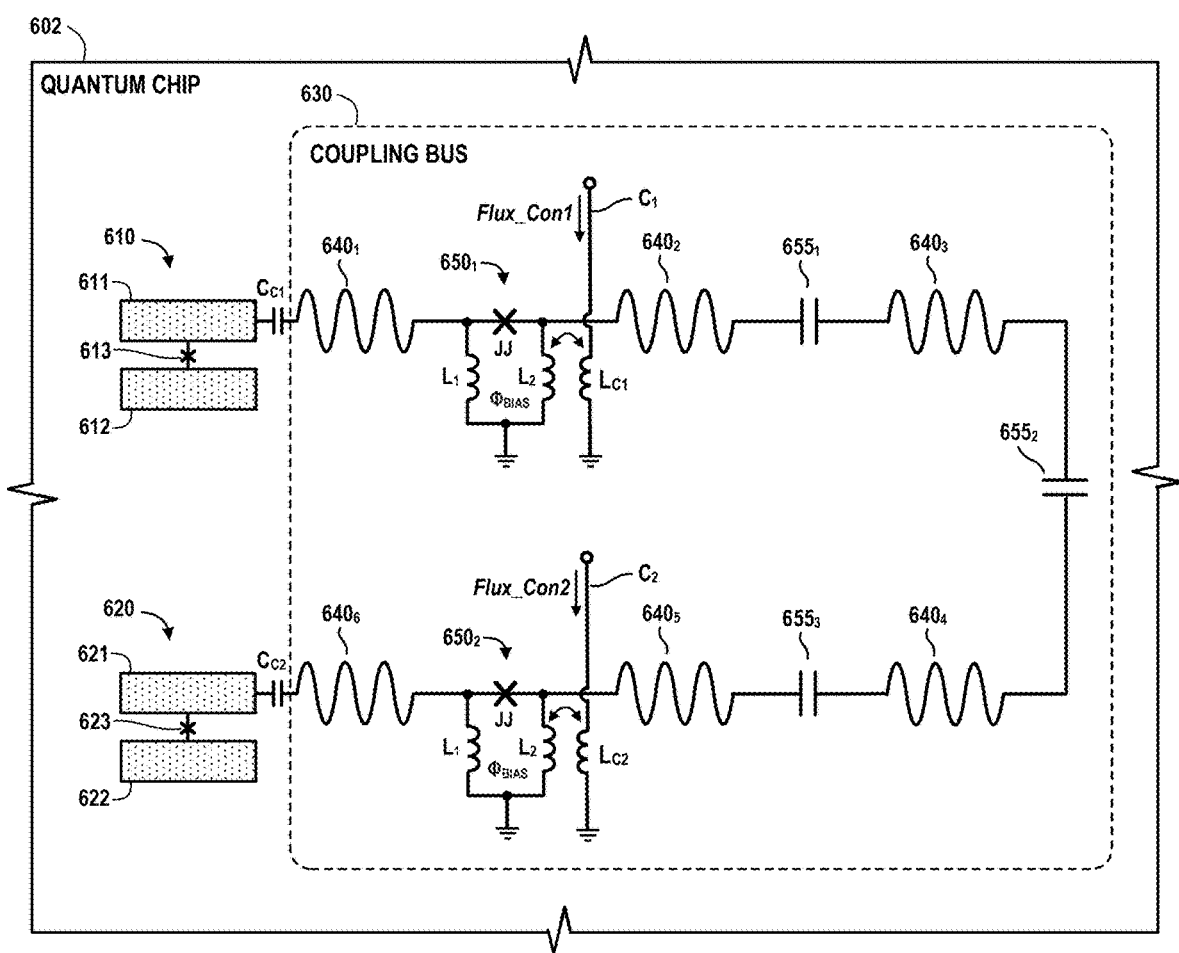
FIG. 6 schematically illustrates a device which comprises a coupling bus that is configured to mediate interactions between quantum bits, according to another exemplary embodiment of the disclosure.

In other embodiments, as noted above, long-range qubit-qubit exchange interactions can be mediated using coupling buses which comprise multiple transmission line resonators that are coupled together using a combination of flux-tunable inductive couplers and fixed coupling components (coupling capacitors and/or coupling inductors). For example, FIG. 6 schematically illustrates a device which comprises a coupling bus that is configured to mediate interactions between quantum bits, according to another exemplary embodiment of the disclosure, in which the coupling bus comprises multiple transmission line resona-tors that are coupled together using flux-tunable inductive couplers and fixed coupling capacitors. In particular, FIG. 6 schematically illustrates a device 600 which comprises a quantum chip 602 and various components disposed on the quantum chip 602, where such components include, but are not limited to, a first qubit 610, a second qubit 620, and a coupling bus 630 that is coupled to and between the first and second qubits 610 and 620. In some embodiments, the first and second qubits 610 and 620 comprise fixed-frequency superconducting transmon qubits, wherein the first qubit 610 comprises a first superconducting pad 611, a second super-conducting pad 612, and a Josephson junction 613, and the second qubit 620 comprises a first superconducting pad 621, a second superconducting pad 622, and a Josephson junction 623.

The coupling bus 630 comprises a plurality of transmis-sion line resonators $640_1$, $640_2$, $640_3$, $640_4$, $640_5$, and $640_6$ (e.g., CPW resonators), a plurality of flux-tunable inductive couplers $650_1$ and $650_2$ (e.g., RF-SQUIDs), and a plurality of fixed coupling capacitors $655_1$, $655_2$, and $655_3$. The coupling bus 630 is similar in structure and operation as the coupling bus 230 discussed above in conjunction with FIG. 2, except that the coupling bus 630 implements the fixed coupling capacitors $655_1$, $655_2$, and $655_3$ in place of the flux-tunable inductive couplers $250_2$, $250_3$, and $250_4$ of the coupling bus 230 (FIG. 2). In the exemplary configuration of the coupling bus 630 of FIG. 6, the coupling between the transmission line resonators $640_2$, $640_3$, $640_4$, and $640_5$ is always "ON" by virtue of the fixed capacitive coupling provided by the fixed coupling capacitors $655_1$, $655_2$, and $655_3$, while the activation (turning ON) and deactivation (turning OFF) of the coupling bus 630 is controlled by tuning the flux-tunable inductive couplers $650_1$ and $650_2$ into ON states and OFF states using flux tuning techniques as discussed above.

Figure 7:
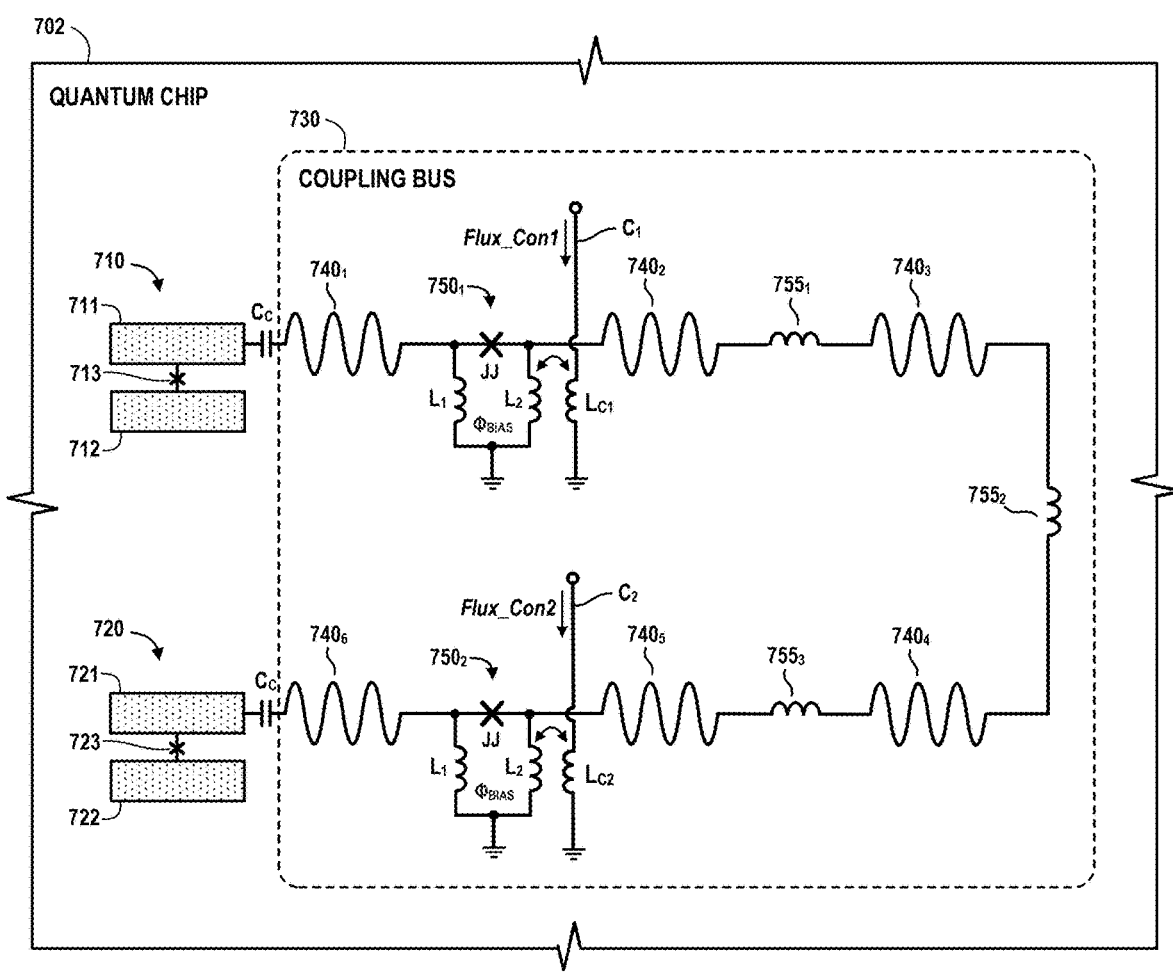
FIG. 7 schematically illustrates a device which comprises a coupling bus that is configured to mediate interactions between quantum bits, according to another exemplary embodiment of the disclosure.

Next, FIG. 7 schematically illustrates a device which comprises a coupling bus that is configured to mediate interactions between quantum bits, according to another exemplary embodiment of the disclosure, in which the coupling bus comprises multiple transmission line resona-tors that are coupled together using flux-tunable inductive couplers and fixed coupling inductors. In particular, FIG. 7 schematically illustrates a device 700 which comprises a quantum chip 702 and various components disposed on the quantum chip 702, where such components include, but are not limited to, a first qubit 710, a second qubit 720, and a coupling bus 730 that is coupled to and between the first and second qubits 710 and 720. In some embodiments, the first and second qubits 710 and 720 comprise fixed-frequency superconducting transmon qubits, where the first qubit 710 comprises a first superconducting pad 711, a second super-conducting pad 712, and a Josephson junction 713, and where the second qubit 720 comprises a first superconduct-ing pad 721, a second superconducting pad 722, and a Josephson junction 723.

The coupling bus 730 comprises a plurality of transmis-sion line resonators $740_1$, $740_2$, $740_3$, $740_4$, $740_5$, and $740_6$ (e.g., CPW resonators), a plurality of flux-tunable inductive couplers $750_1$ and $750_2$ (e.g., RF-SQUIDs), and a plurality of fixed coupling inductors $755_1$, $755_2$, and $755_3$. The coupling bus 730 is similar in structure and operation as the coupling bus 630 of FIG. 6, except that the coupling bus 730 implements the fixed coupling inductors $755_1$, $755_2$, and $755_3$ in place of the fixed coupling capacitors $655_1$, $655_2$, and $655_3$ of the coupling bus 630 (FIG. 6). In the exemplary configuration of the coupling bus 730 of FIG. 7, the coupling between the transmission line resonators $740_2$, $740_3$, $740_4$, and $740s$ is always "ON" by virtue of the fixed inductive coupling provided by the fixed coupling inductors $755_1$, $755_2$, and $755_3$, while the activation (turning ON) and deactivation (turning OFF) of the coupling bus 730 is controlled by tuning the flux-tunable inductive couplers $750_1$ and $750_2$ into ON states and OFF states using flux tuning techniques as discussed above.

The exemplary configurations of the coupling buses 630 and 730 as shown in FIGS. 6 and 7 include a series of transmission line resonators which are coupled using a fixed coupling through fixed coupling capacitors or inductors, and dynamic, tunable inductive coupling through flux-tunable inductive couplers. While the exemplary embodiments of the coupling buses shown in FIGS. 6 and 7 comprises six (6) transmission line resonators, two (2) flux-tunable inductive couplers, and four (4) fixed coupling elements, it is to be understood that other embodiments of long-range coupling buses can be constructed using more or less of any of transmission line resonators, flux-tunable inductive couplers, and fixed coupling elements, as desired for a given application. By way of example, a long-range coupling bus can be implemented which is similar in structure to the coupling bus 530 shown in FIG. 5, where the flux-tunable inductive coupler $550_2$ is replaced with a fixed coupling capacitor or a fixed coupling inductor. It is to be further noted that in other exemplary embodiments, a long-range coupling bus can be implemented using a single flux-tunable inductive coupler that is disposed between two adjacent transmission line resonators at any point of the coupling bus, e.g., adjacent to a given qubit, or in the middle portion of the coupling bus. However, implementing two or more flux-tunable inductive couplers in a coupling bus provides better tunability and control of qubit-qubit exchange interactions.

Figure 8:
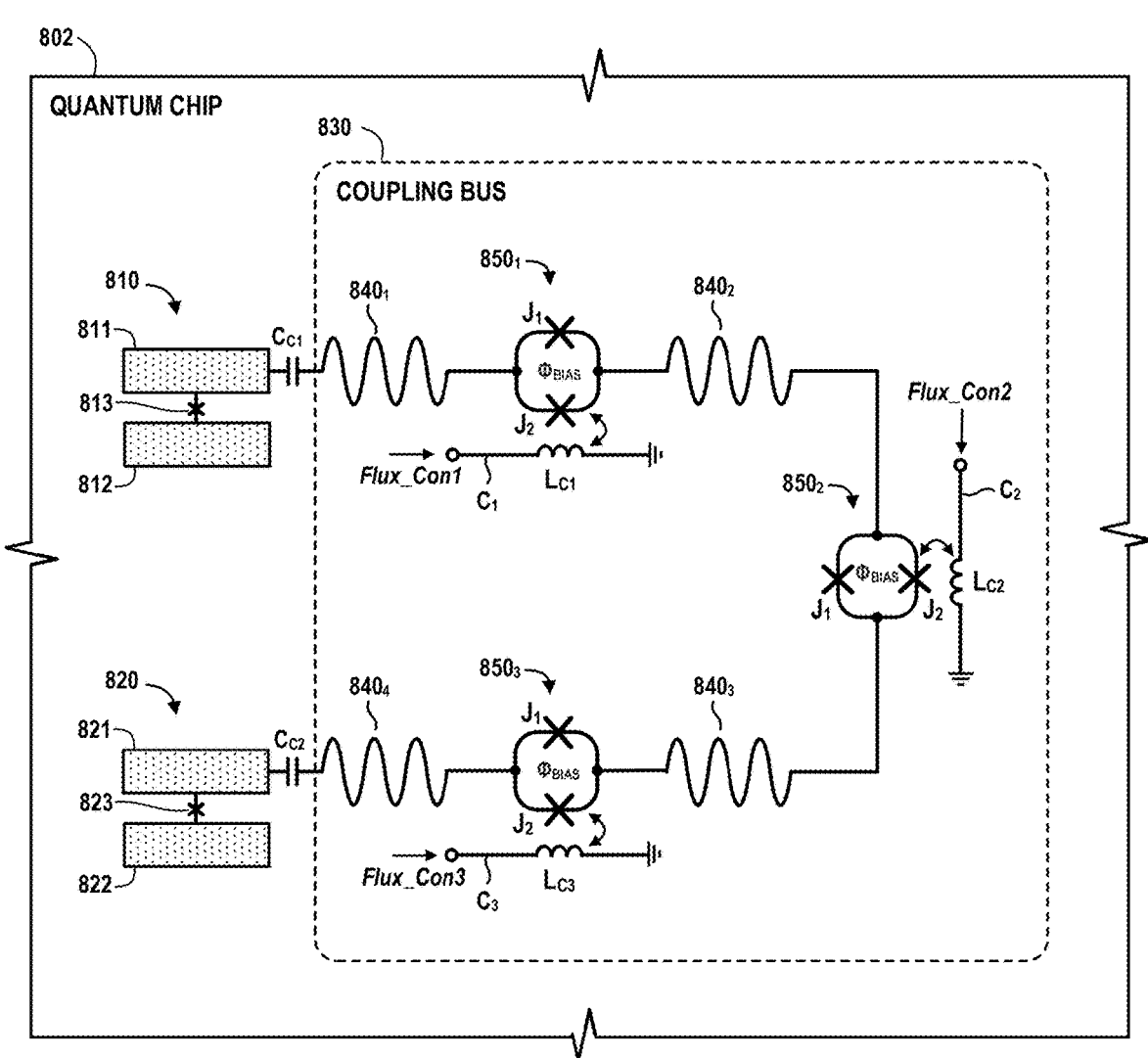
FIG. 8 schematically illustrates a device which comprises a coupling bus that is configured to mediate interactions between quantum bits, according to another exemplary embodiment of the disclosure.

Moreover, while the exemplary coupling bus embodiments discussed above utilize RF-SQUIDs to implement the flux-tunable inductive couplers, in other embodiments, lone-range coupling buses can be constructed using other types of flux-tunable inductive components to provide dynamic, tunable inductive coupling of adjacent transmission line resonators of the coupling bus. For example, FIG. 8 schematically illustrates a device which comprises a coupling bus that is configured to mediate interactions between quantum bits, according to another exemplary embodiment of the disclosure, in which the coupling bus utilizes DC-SQUIDs as flux-tunable inductive couplers to control inductive coupling between adjacent transmission line resonators. In particular, FIG. 8 schematically illustrates a device 800 which comprises a quantum chip 802 and various components disposed on the quantum chip 802, where such components include, but are not limited to, a first qubit 810, a second qubit 820, and a coupling bus 830 that is coupled to and between the first and second qubits 810 and 820. In some embodiments, the first and second qubits 810 and 820 comprise fixed-frequency superconducting transmon qubits, where the first qubit 810 comprises a first superconducting pad 811, a second superconducting pad 812, and a Josephson junction 813, and where the second qubit 820 comprises a first superconducting pad 821, a second superconducting pad 822, and a Josephson junction 823.

The coupling bus 830 comprises a plurality of transmission line resonators $840_1$, $840_2$, $840_3$, and $840_4$ (e.g., CPW resonators), and a plurality of flux-tunable inductive couplers $850_1$, $850_2$, and $850_3$ which are implemented using nominally identical DC-SQUIDs. The exemplary coupling bus 830 is similar in structure and operation as the coupling bus 530 discussed above in conjunction with FIG. 5, except that the coupling bus 830 utilizes DC-SQUIDs to implement the flux-tunable inductive couplers $850_1$, $850_2$, and $850_3$ instead of RF-SQUIDs, to dynamically control the inductive coupling between adjacent transmission line resonators. As schematically shown in FIG. 8, each DC-SQUID comprises a superconducting loop which comprises two Josephson junctions including a first Josephson junction J1 and a second Josephson junction J2, which have non-linear inductances.

As schematically illustrated in FIG. 8, similar to the exemplary embodiment discussed above, the flux-tunable inductive couplers $850_1$, $850_2$, and $850_3$ are disposed adjacent to respective coupling inductors $L_{C1}$, $L_{C2}$, and $L_{C3}$, where each coupling inductor $L_{C1}$, $L_{C2}$, and $L_{C3}$ is connected in series (inline) with a respective control line $C_1$, $C_2$, and $C_3$ on which respective flux bias control signals Flux_Con1, Flux_Con2, and Flux_Con3 (e.g., control currents) are applied to generate magnetic fluxes for tuning each of the flux-tunable inductive couplers $850_1$, $850_2$, and $850_3$ into an ON state or OFF state to control the inductive coupling between adjacent transmission line resonators. The inductance of a given DC-SQUID is modulated by an amount of magnetic flux bias $\Phi_{BIAS}$ which threads through the superconducting loop of the DC-SQUID. In this regard, the inductance of a given DC-SQUID is modulated by flux-tuning the DC-SQUID to selectively place a flux-tunable inductive coupler into (i) an ON state to enable coupling between adjacent transmission line resonators) or (ii) an OFF state to disrupt/break the coupling between adjacent transmission line resonators.

It is to be appreciated that the exemplary coupling bus architectures as discussed herein enable long-range, highly tunable control of exchange interactions between superconducting qubits. The exemplary coupling bus architectures are designed to eliminate low-frequency modes that are normally present in long-range buses, and provide fast and high ON/OFF ratios of qubit-qubit exchange coupling by virtue of (i) separating a coupling bus into multiple segments of transmission line resonators and (ii) utilizing flux-tunable inductive couplers (e.g., RF-SQUIDs, DC-SQUIDs, etc.) to dynamically control the inductive coupling of the transmission line resonators, or utilizing a combination of flux-tunable inductive couplers and fixed interactions using fixed coupling capacitor or coupling inductors, to couple the multiple segments of transmission line resonators.

FIG. 9 schematically illustrates a quantum computing system which comprises a quantum processor having superconducting qubits that are coupled by long-range coupling buses, according to an exemplary embodiment of the disclosure. In particular, FIG. 9 schematically illustrates a quantum computing system 900 which comprises a quantum computing platform 910, a control system 920, and a quantum processor 930 (or quantum processing unit (QPU)). In some embodiments, the quantum computing platform 910 implements a software platform that is configured to program a quantum computer to execute quantum computing algorithms 912 which are implemented using, e.g., quantum circuits that define computational routines consisting of coherent quantum operations on quantum data, such as qubits. In addition, in some embodiments, the quantum computing platform 910 implements software control processes 914 to control and synchronize the generation of flux-bias control signals (e.g., FIG. 3) for controlling the operation of flux-tunable inductive couplers (e.g., RF-SQUIDs, DC-SQUIDs, etc.) of long-range coupling buses to mediate qubit-qubit exchange interactions when performing, e.g., two-qubit gate operations, as discussed herein.

In some embodiments, the control system 920 comprises a multi-channel arbitrary waveform generator 922, and flux bias control signal generators 924. The quantum processor 930 comprises one or more solid-state quantum chip which collectively implement a superconducting qubit array 932 comprising a plurality of long-range coupling buses that are configured to couple pairs of qubits, and which implement a network 934 of qubit drive lines, readout resonator lines, flux-bias control lines, etc., and other circuit QED components that may be needed for a given application or quantum system configuration. In some embodiments, the long-range coupling buses comprise one or more instances of the exemplary long-range coupling buses discussed above.

In some embodiments, the control system 920 and the quantum processor 930 are disposed at different stages of a dilution refrigeration system 940 which can generate cryogenic temperatures that are sufficient to operate components of the control system 920 for quantum computing applications. For example, the quantum processor 930 may need to be cooled down to near-absolute zero, e.g., 10-15 millikelvin (mK), to allow the superconducting qubits to exhibit quantum behaviors. In some embodiments, the dilution refrigeration system 940 comprises a multi-stage dilution refrigerator where the components of the control system 920 can be maintained at different cryogenic temperatures, as needed. For example, while the quantum processor 930 may need to be cooled down to, e.g., 10-15 mK, the circuit components of the control system 920 may be operated at cryogenic temperatures greater than 10-15 mK (e.g., cryogenic temperatures in a range of 3K-4K), depending on the configuration of the quantum computing system. In other embodiments, some or all of the components of the control system 920 are disposed and operated in a room temperature environment.

In some embodiments, the superconducting qubit array 932 comprises a quantum system of superconducting qubits, superconducting qubit couplers, and other components commonly utilized to support quantum processing using qubits. The number of superconducting qubits of the superconducting qubit array 932 can be on the order of tens, hundreds, thousands, or more, etc. The network 934 of qubit drive lines, readout resonator lines, and flux bias control lines, etc., is coupled to the control system 920 through a suitable hardware input/output (I/O) interface, which couples I/O and control signals between the control system 920 and the quantum processor 930. For example, the hardware I/O interface may comprise various types of hardware and components, such as RF cables, wiring, RF elements, optical fibers, heat exchanges, filters, amplifiers, isolators, etc.

In some embodiments, the multi-channel AWG 922 and other suitable microwave pulse signal generators are configured to generate the microwave control pulses that are applied to the qubit drive lines and other types of active qubit-qubit couplers (for mediated short-range qubit-qubit interactions) to control the operation of the superconducting qubits and associated qubit coupler circuitry of the superconducting qubit array 932, when performing various gate operations to execute a given certain quantum information processing algorithm. The multi-channel AWG 922 generates and selectively applies microwave control pulses to the qubit drive lines of respective superconducting qubits to change the quantum state of the superconducting qubits (e.g., change the quantum state of a given qubit between the ground state and excited state, or to a superposition state) when executing quantum information processing algorithms. In addition, the multi-channel AWG 922 generates and selectively applies microwave control pulses to qubit coupler drive lines to activate/deactivate qubit couplers that couple respective pairs of qubits to perform multi-gate entanglement operations (e.g., two qubit gate operations) when executing quantum information processing algorithms.

In some embodiments, the multi-channel AWG 922 comprises a plurality of AWG channels, which control respective superconducting qubits within the superconducting qubit array 932 of the quantum processor 930. In some embodiments, each AWG channel comprises a baseband signal generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels. In some embodiments, the multi-channel AWG 922 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

The quantum computing platform 910 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 910 comprises a hardware architecture of processors, memory, etc., which is configured to control the execution of quantum applications, and interface with the control system 920 to (i) generate digital control signals that are converted to analog microwave control signals by the control system 920, to control operations of the quantum processor 930 when executing a given quantum application, and (ii) to obtain and process digital signals received from the control system 920, which represent the processing results generated by the quantum processor 930 when executing various gate operations for a given quantum application.

In some exemplary embodiments, the quantum computing platform 910 of the quantum computing system 900 may be implemented using any suitable computing system architecture (e.g., as shown in FIG. 10) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

FIG. 10 schematically illustrates an exemplary architecture of a computing environment for hosting a quantum computing platform and performing quantum information processing, according to an exemplary embodiment of the disclosure. The computing environment 1000 of FIG. 10 contains an example of an environment for the execution of at least some of the computer code (block 1026) involved in executing, e.g., quantum computing algorithms, and control algorithms to dynamically control the activation and deactivate of coupling buses (e.g., long range coupling buses as discussed herein). In addition to block 1026, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 1026, as identified above), peripheral device set 1014 (including user interface (UI), device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

Computer 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

Processor set 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1021 and the other storage media discussed below. The program instructions, and associated data, are accessed by processor set 1010 to control and direct performance of the inventive methods. In computing environment 1000, at least some of the instructions for performing the inventive methods may be stored in block 1026 in persistent storage 1013.

Communication fabric 1011 is the signal conduction path that allow the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1012 is any type of volatile memory now known or to be developed in the future. Examples include dynamic type random access memory (RAM) or static type RAM. Typically, the volatile memory is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

Persistent storage 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid-state storage devices. Operating system 1022 may take several forms, such as various known proprietary operating systems or open source Portable Operating System Interface type operating systems that employ a kernel. The code included in block 1026 typically includes at least some of the computer code involved in performing the inventive methods.

Peripheral device set 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

Network module 1015 is the collection of computer software, hardware, and firmware that allows computer 1001 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the inventive methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1003 is any computer system that is used and controlled by an end user (for example, a customer of an enterprise that operates computer 1001), and may take any of the forms discussed above in connection with computer 1001. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

Remote server 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

Public cloud 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, and to enable others of ordinary skill in the art to understand the embodiments disclosed herein.

What is claimed is:

1. A device, comprising:
a first quantum bit;
a second quantum bit; and
a coupling bus connecting the first quantum bit and the second quantum bit, wherein the coupling bus comprises a plurality of transmission line resonators which are coupled in series, and at least one tunable inductive coupler to control a coupling between a first transmission line resonator and a second transmission line resonator of the plurality of transmission line resonators.

2. The device of claim 1, wherein the at least one tunable inductive coupler is configured to be tuned into one of: a first operating state to couple the first transmission line resonator and the second transmission line resonator to enable exchange coupling between the first quantum bit and the second quantum bit over the coupling bus; and a second operating state to decouple the first transmission line resonator and the second transmission line resonator to suppress exchange coupling between the first quantum bit and the second quantum bit over the coupling bus.

3. The device of claim 1, wherein the plurality of transmission line resonators comprise nominally identical coplanar waveguide resonators.

4. The device of claim 1, wherein the at least one tunable inductive coupler comprises a superconducting loop comprising at least one Josephson junction.

5. The device of claim 1, wherein the at least one tunable inductive coupler comprises a radio frequency superconducting quantum interference device.

6. The device of claim 1, wherein the at least one tunable inductive coupler comprises a direct current superconducting quantum interference device.

7. The device of claim 1, wherein the coupling bus further comprises at least one fixed coupling device to provide a fixed coupling between the second transmission line resonator and a third transmission line resonator of the plurality of transmission line resonators.

8. The device of claim 7, wherein the fixed coupling device comprises one of a coupling capacitor and a coupling inductor.

9. A system, comprising;
a quantum processor comprising a first quantum bit, a second quantum bit, and a coupling bus connecting the first quantum bit and the second quantum bit, wherein the coupling bus comprises a plurality of transmission line resonators which are coupled in series, and at least one tunable inductive coupler to control a coupling between a first transmission line resonator and a second transmission line resonator of the plurality of transmission line resonators; and
a control system configured to generate a control signal to tune the at least one tunable inductive coupler of the coupling bus into one of: a first operating state to couple the first transmission line resonator and the second transmission line resonator to enable exchange coupling between the first quantum bit and the second quantum bit over the coupling bus; and a second operating state to decouple the first transmission line resonator and the second transmission line resonator to suppress exchange coupling between the first quantum bit and the second quantum bit over the coupling bus.

10. The system of claim 9, wherein the plurality of transmission line resonators of the coupling bus comprise nominally identical coplanar waveguide resonators.

11. The system of claim 9, wherein the at least one tunable inductive coupler comprises a superconducting loop comprising at least one Josephson junction.

12. The system of claim 9, wherein the at least one tunable inductive coupler comprises a radio frequency superconducting quantum interference device.

13. The system of claim 9, wherein the at least one tunable inductive coupler comprises a direct current superconducting quantum interference device.

14. The system of claim 9, wherein the coupling bus further comprises at least one fixed coupling device to provide a fixed coupling between the second transmission line resonator and a third transmission line resonator of the plurality of transmission line resonators.

15. The system of claim 14, wherein the fixed coupling device comprises one of a coupling capacitor and a coupling inductor.

16. A method, comprising:
controlling an exchange interaction between a first quantum bit and a second quantum bit that are connected by a coupling bus which comprises a plurality of transmission line resonators that are coupled in series, and at least one tunable inductive coupler to control a coupling between a first transmission line resonator and a second transmission line resonator of the plurality of transmission line resonators;
wherein controlling the exchange interaction between the first quantum bit and the second quantum bit comprises:
tuning the at least one tunable inductive coupler of the coupling bus into a first operating state to couple the first transmission line resonator and the second transmission line resonator to enable exchange coupling between the first quantum bit and the second quantum bit over the coupling bus; and
tuning the at least one tunable inductive coupler of the coupling bus into a second operating state to decouple the first transmission line resonator and the second transmission line resonator to suppress exchange coupling between the first quantum bit and the second quantum bit over the coupling bus.

17. The method of claim 16, wherein tuning the at least one tunable inductive coupler of the coupling bus into the first operating state to couple the first transmission line resonator and the second transmission line resonator to enable exchange coupling between the first quantum bit and the second quantum bit over the coupling bus, comprises generating a control signal to flux-bias the at least one tunable inductive coupler of the coupling bus into the first operating state to inductively couple the first transmission line resonator and the second transmission line resonator and cause mode hybridization of frequency modes of the first transmission line resonator and the second transmission line resonator to generate a hybridized frequency mode which moves towards respective transition frequencies of the first quantum bit and the second quantum bit.

18. The method of claim 17, wherein the first transmission line resonator and the second transmission line resonator are nominally identical and have a resonant frequency that is greater than the respective transition frequencies of the first quantum bit and the second quantum bit, wherein the hybridized frequency mode has a frequency that is less than the resonant frequency of the first and second transmission line resonators.

19. The method of claim 16, wherein
the plurality of transmission line resonators comprise nominally identical coplanar waveguide resonators; and
the at least one tunable inductive coupler comprises a superconducting loop comprising at least one Josephson junction.

20. The method of claim 16, wherein the at least one tunable inductive coupler comprises one of a radio frequency superconducting quantum interference device, and a direct current superconducting quantum interference device.

* * * * *